(12) United States Patent
Ueda

(10) Patent No.: US 10,684,401 B2
(45) Date of Patent: Jun. 16, 2020

(54) DISPLAY DEVICE AND ELECTRONIC APPARATUS

(71) Applicant: Sony Corporation, Tokyo (JP)

(72) Inventor: Daisuke Ueda, Tokyo (JP)

(73) Assignee: Sony Corporation, Tokyo (JP)

( * ) Notice: Subject to any disclaimer, the term of this patent is extended or adjusted under 35 U.S.C. 154(b) by 4 days.

(21) Appl. No.: 16/080,089

(22) PCT Filed: Mar. 7, 2017

(86) PCT No.: PCT/JP2017/008961
§ 371 (c)(1),
(2) Date: Aug. 27, 2018

(87) PCT Pub. No.: WO2017/169563
PCT Pub. Date: Oct. 5, 2017

(65) Prior Publication Data
US 2019/0056543 A1 Feb. 21, 2019

(30) Foreign Application Priority Data
Mar. 31, 2016 (JP) .................................. 2016-069879

(51) Int. Cl.
*G02B 5/20* (2006.01)
*H01L 27/32* (2006.01)
*G09F 9/30* (2006.01)
*H01L 51/50* (2006.01)
(Continued)

(52) U.S. Cl.
CPC ............... *G02B 5/201* (2013.01); *G02B 5/20* (2013.01); *G09F 9/30* (2013.01); *H01L 27/32* (2013.01); *H01L 27/322* (2013.01); *H01L 51/50* (2013.01); *H05B 33/12* (2013.01); *H05B 33/22* (2013.01)

(58) Field of Classification Search
CPC ............... H01L 27/14621; H01L 27/32; H01L 27/3206; H01L 27/3211; H01L 27/3216; H01L 27/3218; H01L 27/322; H01L 27/3241; H01L 27/3244; H01L 27/326;
(Continued)

(56) References Cited

U.S. PATENT DOCUMENTS

2015/0070552 A1* 3/2015 Lin ...................... H04N 5/2254
348/307
2017/0309844 A1* 10/2017 Saeki .................... G03F 7/0752

FOREIGN PATENT DOCUMENTS

| JP | 11-038426 A | 2/1999 |
| JP | 2011-040352 A | 2/2011 |
| JP | 2014-067576 A | 4/2014 |

(Continued)

*Primary Examiner* — David C Spalla
(74) *Attorney, Agent, or Firm* — Michael Best & Friedrich LLP

(57) ABSTRACT

[Object] To make it possible to improve viewing angle characteristics more.
[Solution] Provided is a display device including: a plurality of light emitting sections formed on a substrate; and a color filter provided on the light emitting section to correspond to each of the plurality of light emitting sections. The light emitting sections and the color filters are arranged such that, in at least a partial region in a display surface, a relative misalignment between a center of a luminescence surface of the light emitting section and a center of the color filter corresponding to the light emitting section is created in a plane perpendicular to a stacking direction.

18 Claims, 13 Drawing Sheets

(51) Int. Cl.
*H05B 33/22* (2006.01)
*H05B 33/12* (2006.01)

(58) Field of Classification Search
CPC ..... H01L 51/50; H01L 51/52; H01L 51/5262; G02B 5/20; G02B 5/201
See application file for complete search history.

(56) References Cited

FOREIGN PATENT DOCUMENTS

JP  2017-009625 A  1/2017
WO  2014/141842 A1  9/2014

\* cited by examiner

DISPLAY DEVICE AND ELECTRONIC APPARATUS

TECHNICAL FIELD

The present disclosure relates to a display device and an electronic apparatus.

BACKGROUND ART

Various technologies to improve viewing angle characteristics in a display device are developed. For example, Patent Literature 1 discloses a display device that expresses white or a neutral color by color mixing of self-luminous elements of a plurality of simple colors (red, green, and blue) and in which the distance from an end of a luminescence region to an end of an opening of a light blocking layer that is provided on the luminescence region is different between a red luminescence region, a green luminescence region, and a blue luminescence region. In the display device described in Patent Literature 1, the rate of luminance reduction by the light blocking of the light blocking layer can be varied between colors by appropriately setting the areas of the openings of the light blocking layers, and thus the differences in viewing angle characteristics between colors can be reduced. Therefore, the chromaticity change of white or a neutral color due to viewing angles can be suppressed.

CITATION LIST

Patent Literature

Patent Literature 1: JP 2011-40352A

DISCLOSURE OF INVENTION

Technical Problem

Here, these days, a display device having a display surface with a relatively small area (hereinafter, occasionally referred to as simply a small-sized display device, for the sake of simplicity), such as a head-mounted display (HMD) or an electronic viewfinder (EVF) of a digital camera, is increasingly often mounted on electronic apparatuses. In such an electronic apparatus, a light beam from the display surface of the display device is caused to form an image on an eyeball of a user via an optical system of a lens, a mirror, a diffraction grating, etc.; the optical system tends to be downsized from demand for further reduction in the weight and size of the electronic apparatus. If the optical system is downsized, it becomes necessary that a light beam be caused to form an image on an eyeball of a user appropriately by means of an optical system of a simpler configuration, and hence it is difficult to supplement the viewing angle characteristics of the display device by modifying the configuration of the optical system; the viewing angle characteristics of the display device directly lead to the quality of display that is visually identified by the user. Therefore, depending on the use, the display device is required to achieve even more improvement in viewing angle characteristics.

Thus, the present disclosure presents a new and improved display device that can improve viewing angle characteristics more and an electronic apparatus on which the display device is mounted.

Solution to Problem

According to the present disclosure, there is provided a display device including: a plurality of light emitting sections formed on a substrate; and a color filter provided on the light emitting section to correspond to each of the plurality of light emitting sections. The light emitting sections and the color filters are arranged such that, in at least a partial region in a display surface, a relative misalignment between a center of a luminescence surface of the light emitting section and a center of the color filter corresponding to the light emitting section is created in a plane perpendicular to a stacking direction.

In addition, according to the present disclosure, there is provided an electronic apparatus including: a display device configured to perform display on a basis of an image signal. The display device includes a plurality of light emitting sections formed on a substrate, and a color filter provided on the light emitting section to correspond to each of the plurality of light emitting sections, and the light emitting sections and the color filters are arranged such that, in at least a partial region in a display surface, a relative misalignment between a center of a luminescence surface of the light emitting section and a center of the color filter corresponding to the light emitting section is created in a plane perpendicular to a stacking direction.

According to the present disclosure, the light emitting sections and the color filters are arranged such that, in at least a partial region in the display surface of the display device, a relative misalignment between the center of the luminescence surface of a light emitting section (for example, in an organic EL display, a light emitting element) and the center of the color filter corresponding to the light emitting section is created in a plane perpendicular to the stacking direction. Therefore, for a pixel including the light emitting section and the color filter, wider viewing angle characteristics can be obtained in the direction of misalignment of the color filter to the luminescence surface of the light emitting section.

Advantageous Effects of Invention

As described above, according to the present disclosure, viewing angle characteristics can be improved more. Note that the effects described above are not necessarily limitative. With or in the place of the above effects, there may be achieved any one of the effects described in this specification or other effects that may be grasped from this specification.

MODE(S) FOR CARRYING OUT THE INVENTION

Figure 1:
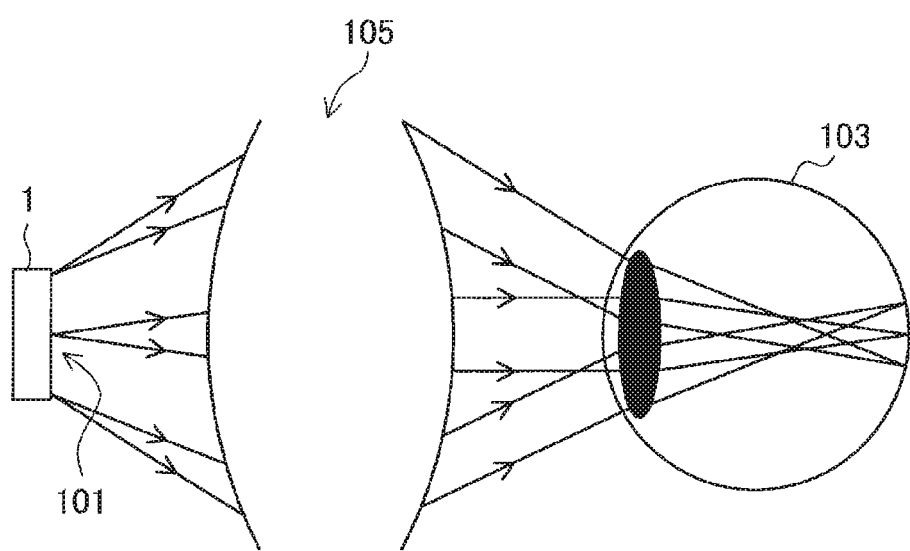
FIG. 1 is a diagram simulatively showing a locus of a light beam from a small-sized display device in an electronic apparatus to an eyeball of a user in a case where an optical system is downsized.

Hereinafter, (a) preferred embodiment(s) of the present disclosure will be described in detail with reference to the appended drawings. Note that, in this specification and the appended drawings, structural elements that have substantially the same function and structure are denoted with the same reference numerals, and repeated explanation of these structural elements is omitted.

Note that the description is given in the following order.
1. Background with which present disclosure is conceived
2. Configuration of display device
3. With regard to amount of misalignment of CF
4. Modification examples
4-1. Methods for creating relative misalignment between light emitting element and CF
4-2. Configuration in which reflector is not provided
4-3. Other methods for setting amount of misalignment L
5. Application examples
6. Supplement 1. Background with which Present Disclosure is Conceived Before describing preferred embodiments of the present disclosure, the background with which the present inventors have conceived the present disclosure is described in order to make the present disclosure clearer.

As described above, a small-sized display device may be mounted on an electronic apparatus in the use of an HMD, an EVF of a digital camera, etc. In such an electronic apparatus, a light beam from a display surface of the display device is caused to form an image on an eyeball of a user via an optical system of a lens, a mirror, a diffraction grating, etc. On the other hand, these days, the demand for further reduction in the weight and size of the electronic apparatus in order to reduce the burden on the user is great. To achieve reduction in the weight and size of the electronic apparatus, also the mounted optical system is required to achieve even more downsizing.

FIG. 1 is a diagram simulatively showing the locus of a light beam from a small-sized display device in an electronic apparatus to an eyeball of a user in a case where an optical system is downsized. As shown in FIG. 1, to achieve reduction in the weight and size of the electronic apparatus, it is necessary to downsize an optical system 105 and make narrower the distance between the optical system 105 and a display device 1. Further, since the optical system 105 cannot be made a complicated configuration, it is difficult to supplement the viewing angle characteristics of the display device 1 by modifying the configuration of the optical system 105. Therefore, a light beam with a wider angle (that is, a light beam with a wider viewing angle) among the light beams emitted from a display surface 101 of the display device 1 is guided to an eyeball 103 of a user while keeping almost the same characteristics as those when the light beam is emitted from the display surface 101 of the display device 1. For the above reasons, in a case where it is attempted to downsize the optical system 105 in an electronic apparatus in which the small-sized display device 1 is used, it is required that, in order to provide high quality display to the user, the display device 1 be able to emit a light beam having desired characteristics even at a wider viewing angle, that is, have more excellent wide viewing angle characteristics.

Here, a display device of a system in which a pixel is formed by providing a color filter (CF) on a white light emitting element and color display is performed by performing color conversion based on the CF on a pixel basis is commonly known. If it is attempted to achieve a wide viewing angle in a display device of such a system, the occurrence of what is called color mixing in which light from one light emitting element is incident on the CF of an adjacent pixel and light emission of a desired color is not obtained is a problem.

In this regard, various methods to suppress color mixing have been proposed until now. For example, there is known a method in which the distance between a light emitting element and a CF (facing gap) is set small as compared to the pixel size. Alternatively, there is known a method in which the area of a luminescence surface of a light emitting element is set much smaller than the area of a CF (the area in a plane perpendicular to the stacking direction).

However, these methods have the following disadvantages. For example, if it is attempted to obtain a structure of a narrow facing gap in a case where the display device is a display device using an organic light emitting diode (OLED) (that is, an organic electro-luminescence (EL) display (OELD display)), it is necessary that an electrode layer, a protection layer, and a CF bonding layer be made thin films; hence, there is a concern that the luminescence characteristics and the protectiveness of the OLED will be greatly reduced. Further, reducing the area of the luminescence surface of the light emitting element leads to reducing the aperture ratio; hence, there is a concern that the luminance will be greatly reduced.

As described hereinabove, it is desired for a small-sized display device, such as one mounted on an electronic apparatus, to achieve even more improvement in wide viewing angle characteristics; however, in methods for achieving a wide viewing angle while suppressing color mixing that have been commonly proposed until now, there has been a concern that other characteristics will be reduced. In view of the circumstances mentioned above, the present inventors conducted extensive studies on technology for a display device that can suppress the occurrence of color mixing and can further improve wide viewing angle characteristics without causing reduction in other characteristics like those described above, such as a reduction in luminance; and consequently have conceived the present disclosure.

In the following, preferred embodiments of the present disclosure conceived by the present inventors are described in detail. Note that, in the following, an embodiment in which the display device is an organic EL display is described as an example of the present disclosure. However, the present disclosure is not limited to this example, and the display device that is an object of the present disclosure may be various display devices as long as they are display devices that can achieve color display using CFs, such as a liquid crystal display, a plasma display, and an electronic paper device.

2. Configuration of Display Device

Figure 2:
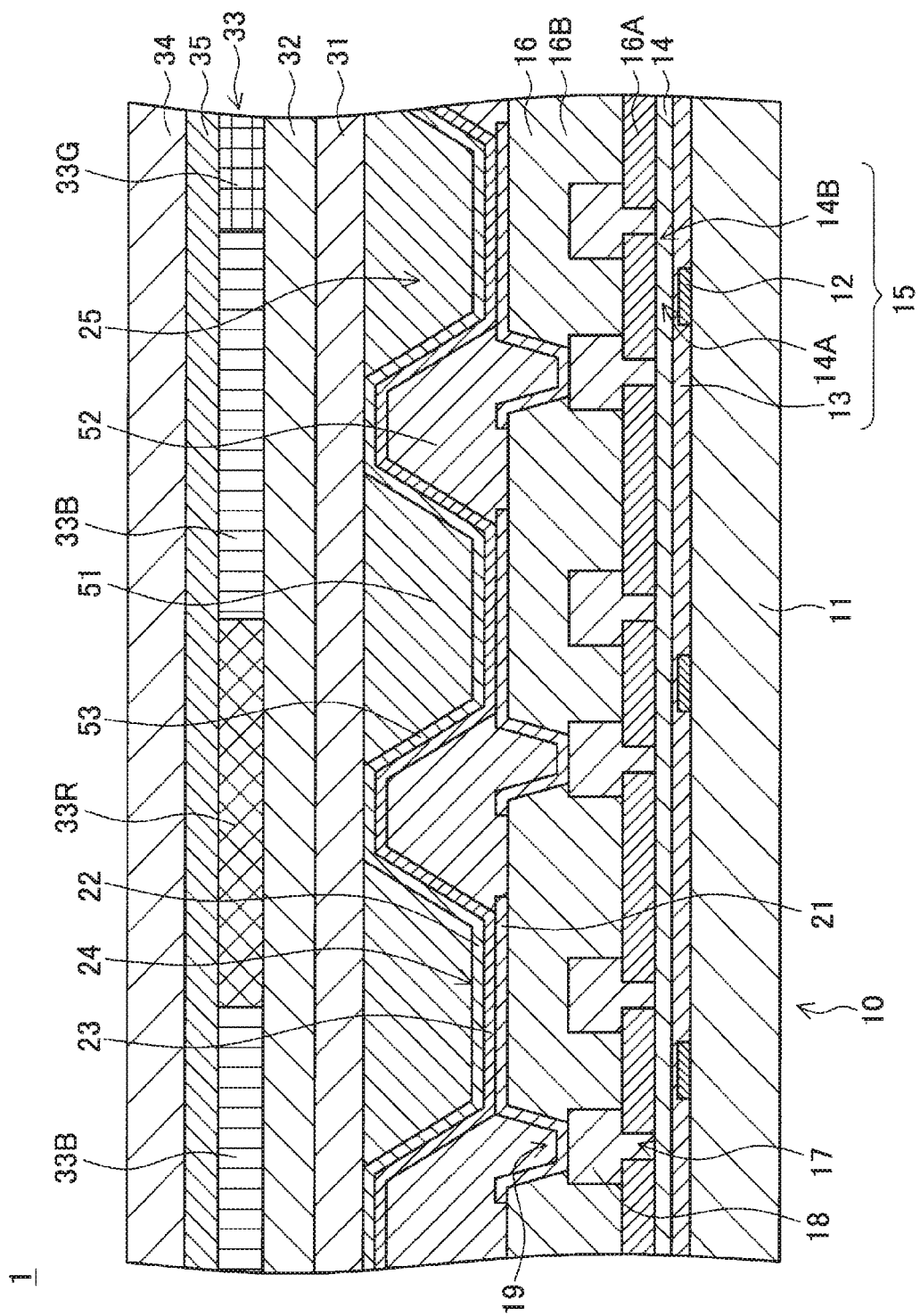
FIG. 2 is a cross-sectional view showing a configuration example of a display device according to the present embodiment.

The configuration of a display device according to a preferred embodiment of the present disclosure will now be described with reference to FIG. 2. FIG. 2 is a cross-sectional view showing a configuration example of a display device according to the present embodiment. FIG. 2 shows a schematic partial cross-sectional view of a display device according to the present embodiment.

Referring to FIG. 2, a display device 1 according to the present embodiment includes, on a first substrate 11, a plurality of light emitting elements 10 each of which includes an OLED and emits white light, and a CF layer 33 that is provided on the light emitting elements 10 and in which CFs of some colors are formed to correspond to the light emitting elements 10. Further, a second substrate 34 containing a material transparent to the light from the light emitting element 10 is placed on the CF layer 33. Further, on the first substrate 11, thin film transistors (TFTs) 15 for driving the light emitting elements 10 are provided to correspond to the light emitting elements 10. An arbitrary light emitting element 10 is selectively driven by the TFT 15, then light from the driven light emitting element 10 passes through the corresponding CF, and the color of the light is converted appropriately and the converted light is emitted from the upper side via the second substrate 34; thereby, desired images, characters, etc. are displayed.

Note that, in the following description, the stacking direction of the layers in the display device 1 is referred to also as an up and down direction. In this event, the side on which the first substrate 11 is placed is defined as a down side, and the side on which the second substrate 34 is placed is defined as an up side. Further, a plane perpendicular to the up and down direction is referred to also as a horizontal plane.

Thus, the display device 1 shown in FIG. 2 is a top emission display device capable of color display that is driven by an active matrix system. However, the present embodiment is not limited to this example, and the display device according to the present embodiment may be a display device that is driven by another system such as a passive matrix system, or may be a bottom emission display device that emits light via the first substrate 11.

Note that the display device 1 may be mounted on various electronic apparatuses having a display function. Specifically, the display device 1 may be used as, for example, a monitor device that is incorporated in a television device, an electronic book, a smartphone, a personal digital assistant (PDA), a notebook personal computer (PC), a video camera, a game apparatus, or the like. Alternatively, the display device 1 may be used for an EVF of a digital camera, an HMD, or the like. As described later, the display device 1 has excellent wide viewing angle characteristics even if a complicated optical system is not provided; thus, the display device 1 can be suitably used for, among the above electronic apparatuses, an electronic apparatus that is used by being carried by a user, which is required to achieve weight and size reduction more (among the examples described above, a smartphone, a PDA, a digital camera, an HMD, or the like).

(First Substrate and Second Substrate)

In the illustrated configuration example, the first substrate 11 includes a silicon substrate. Further, the second substrate 34 contains quartz glass. However, the present embodiment is not limited to this example, and various known materials may be used as the first substrate 11 and the second substrate 34. For example, each of the first substrate 11 and the second substrate 34 may include a high strain point glass substrate, a soda-lime glass (a mixture of $Na_2O$, CaO, and $SiO_2$) substrate, a borosilicate glass (a mixture of $Na_2O$, $B_2O_3$, and $SiO_2$) substrate, a forsterite ($Mg_2SiO_4$) substrate, a lead glass (a mixture of $Na_2O$, PbO, and $SiO_2$) substrate, various glass substrates in which an insulating film is formed on a surface, a quartz substrate, a quartz substrate in which an insulating film is formed on a surface, a silicon substrate in which an insulating film is formed on a surface, or an organic polymer substrate (for example, polymethyl methacrylate (PMMA), polyvinyl alcohol (PVA), polyvinylphenol (PVP), a polyether sulfone (PES), a polyimide, a polycarbonate, polyethylene terephthalate (PET), or the like). The materials contained in the first substrate 11 and the second substrate 34 may be the same, or may be different. However, since the display device 1 is of the top emission type as described above, the second substrate 34 preferably contains a material with a high transmittance that can transmit the light from the light emitting element 10 favorably.

(Light Emitting Element and Second Member)

The light emitting element 10 includes a first electrode 21, an organic layer 23 provided on the first electrode 21, and a second electrode 22 formed on the organic layer 23. More specifically, a second member 52 in which openings 25 are provided so as to expose at least parts of the first electrode 21 is stacked on the first electrode 21, and the organic layer 23 is provided on portions of the first electrode 21 that are exposed at the bottoms of the openings 25. That is, the light emitting element 10 has a configuration in which the first electrode 21, the organic layer 23, and the second electrode 22 are stacked in this order in the opening 25 of the second member 52. This stacked structure functions as a luminescence section 24 of each pixel. That is, a portion of the light emitting element 10 falling under the opening 25 of the second member 52 serves as a luminescence surface. Further, the second member 52 functions as a pixel defining film that is provided between pixels and partitions the area of the pixel.

The organic layer 23 includes a luminescence layer containing an organic luminescent material, and can emit white light. The specific configuration of the organic layer 23 is not limited, and may be various publicly known configurations. For example, the organic layer 23 may have a stacked structure of a hole transport layer, a luminescence layer, and an electronic transport layer, a stacked structure of a hole transport layer and a luminescence layer that serves also as an electronic transport layer, a stacked structure of a hole injection layer, a hole transport layer, a luminescence layer, an electronic transport layer, and an electron injection layer, or the like. Further, in a case where each of these stacked structures or the like is used as a "tandem unit," the organic layer 23 may have a tandem structure of two stages in which a first tandem unit, a connection layer, and a second tandem unit are stacked. Alternatively, the organic layer 23 may have a tandem structure of three or more stages in which three or more tandem units are stacked. In a case where the organic layer 23 includes a plurality of tandem units, an organic layer 23 that emits white light as a whole can be obtained by assigning red, green, and blue to the luminescent colors of the luminescence layers of the tandem units.

In the illustrated configuration example, the organic layer 23 is formed by depositing an organic material by vacuum vapor deposition. However, the present embodiment is not limited to this example, and the organic layer 23 may be formed by various publicly known methods. For example, as the method for forming the organic layer 23, physical vapor deposition methods (PVD methods) such as the vacuum vapor deposition method, printing methods such as the screen printing method and the inkjet printing method, a laser transfer method in which a stacked structure of a laser absorbing layer and an organic layer formed on a substrate for transfer is irradiated with laser light to separate the organic layer on the laser absorbing layer and the organic layer is transferred, various application methods, etc. may be used.

The first electrode 21 functions as an anode. Since the display device 1 is of the top emission type as described above, the first electrode 21 contains a material capable of reflecting the light from the organic layer 23. In the illustrated configuration example, the first electrode 21 contains an alloy of aluminum and neodymium (Al—Nd alloy). Further, the film thickness of the first electrode 21 is approximately 0.1 µm to 1 µm, for example. However, the present embodiment is not limited to this example, and the first electrode 21 may contain various publicly known materials used as the material of an electrode on the light reflection side that functions as an anode in a common organic EL display. Further, the film thickness of the first electrode 21 is not limited to the above example either, and the first electrode 21 may be formed in film thickness ranges commonly employed in organic EL displays, as appropriate.

For example, the first electrode 21 may contain a metal with a high work function, such as platinum (Pt), gold (Au), silver (Ag), chromium (Cr), tungsten (W), nickel (Ni), copper (Cu), iron (Fe), cobalt (Co), or tantalum (Ta), or an alloy with a high work function (for example, a Ag—Pd—Cu alloy containing silver as a main component and containing 0.3 mass % to 1 mass % of palladium (Pd) and 0.3 mass % to 1 mass % of copper, an Al—Nd alloy, or the like). Alternatively, the first electrode 21 may contain an electrically conductive material having a small work function value and a high light reflectance, such as aluminum or an alloy containing aluminum. In this case, it is preferable to improve hole injection properties by providing an appropriate hole injection layer on the first electrode 21, or the like. Alternatively, the first electrode 21 may have a structure in which a transparent electrically conductive material excellent in hole injection characteristics, such as an oxide of indium and tin (ITO) or an oxide of indium and zinc (IZO), is stacked on a reflective film with high light reflectivity such as a dielectric multiple-layer film or aluminum.

The second electrode 22 functions as a cathode. Since the display device 1 is of the top emission type as described above, the second electrode 22 contains a material capable of transmitting the light from the organic layer 23. In the illustrated configuration example, the second electrode 22 contains an alloy of magnesium and silver (Mg—Ag alloy). Further, the film thickness of the second electrode 22 is approximately 10 nm, for example. However, the present embodiment is not limited to this example, and the second electrode 22 may contain various publicly known materials used as the material of an electrode on the light transmission side that functions as a cathode in a common organic EL display. Further, the film thickness of the second electrode 22 is not limited to the above example either, and the second electrode 22 may be formed in film thickness ranges commonly employed in organic EL displays, as appropriate.

For example, the second electrode 22 may contain aluminum, silver, magnesium, calcium (Ca), sodium (Na), strontium (Sr), an alloy of an alkali metal and silver, an alloy of an alkaline earth metal and silver (for example, an alloy of magnesium and silver (Mg—Ag alloy)), an alloy of magnesium and calcium (Mg—Ca alloy), an alloy of aluminum and lithium (Al—Li alloy), or the like. In a case where each of these materials is used in a single layer, the film thickness of the second electrode 22 is approximately 4 nm to 50 nm, for example. Alternatively, the second electrode 22 may have a structure in which a layer of any of the materials described above and a transparent electrode containing, for example, ITO or IZO (with a thickness of, for example, approximately 30 nm to 1 µm) are stacked from the organic layer 23 side. In a case where such a stacked structure is used, the thickness of the layer of any of the materials described above may be as thin as approximately 1 nm to 4 nm, for example. Alternatively, the second electrode 22 may include only a transparent electrode. Alternatively, the second electrode 22 may be provided with a bus electrode (auxiliary electrode) containing a low resistance material, such as aluminum, an aluminum alloy, silver, a silver alloy, copper, a copper alloy, gold, or a gold alloy, to reduce the resistance of the second electrode 22 as a whole.

In the illustrated configuration example, each of the first electrode 21 and the second electrode 22 is formed by forming a material as a film with a prescribed thickness by the vacuum vapor deposition method and then patterning the film by the etching method. However, the present embodiment is not limited to this example, and the first electrode 21 and the second electrode 22 may be formed by various publicly known methods. Examples of the method for forming the first electrode 21 and the second electrode 22 include vapor deposition methods including the electron beam vapor deposition method, the hot filament vapor deposition method, and the vacuum vapor deposition method, the sputtering method, the chemical vapor deposition method (CVD method), the metal organic chemical vapor deposition method (MOCVD method), a combination of the ion plating method and the etching method, various printing methods (for example, the screen printing method, the inkjet printing method, the metal mask printing method, etc.), plating methods (the electroplating method, the electroless plating method, etc.), the lift-off method, the laser ablation method, the sol-gel method, etc.

The second member 52 is formed by forming $SiO_2$ as a film with a prescribed film thickness by the CVD method and then patterning the $SiO_2$ film using photolithography technology and etching technology. However, the material of the second member 52 is not limited to this example, and various materials having insulating properties may be used as the material of the second member 52. Examples of the material contained in the second member 52 include $SiO_2$, MgF, LiF a polyimide resin, an acrylic resin, a fluorine resin, a silicone resin, a fluorine-based polymer, a silicone-based polymer, etc. However, as described later, the second member 52 contains a material having a lower refractive index than the material of a first member 51.

(Configuration of Parts Below Light Emitting Element)

On the first substrate 11, the first electrode 21 included in the light emitting element 10 is provided on an interlayer insulating layer 16 containing SiON. Then, the interlayer insulating layer 16 covers a light emitting element driving section formed on the first substrate 11.

The light emitting element driving section includes a plurality of TFTs 15. In the illustrated example, one TFT 15 is provided for one light emitting element 10. The TFT 15 includes a gate electrode 12 formed on the first substrate 11, a gate insulating film 13 formed on the first substrate 11 and the gate electrode 12, and a semiconductor layer 14 formed on the gate insulating film 13. A region of the semiconductor layer 14 located immediately above the gate electrode 12 functions as a channel region 14A, and regions located so as to sandwich the channel region 14A function as source/drain regions 14B. Note that, although in the illustrated example the TFT 15 is of a back gate type, the present embodiment is not limited to this example, and the TFT 15 may be of a bottom gate type.

An interlayer insulating layer 16 including two layers (a lower layer interlayer insulating layer 16A and an upper layer interlayer insulating layer 16B) is stacked on the semiconductor layer 14 by the CVD method. In this event, after the lower layer interlayer insulating layer 16A is stacked, contact holes 17 are provided in portions of the lower layer interlayer insulating layer 16A corresponding to the source/drain regions 14B so as to expose the source/drain regions 14B, by using photolithography technology and etching technology, for example, and an interconnection 18 containing aluminum is formed so as to fill the contact hole 17. The interconnections 18 are formed by combining the vacuum vapor deposition method and the etching method, for example. After that, the upper layer interlayer insulating layer 16B is stacked.

In a portion of the upper layer interlayer insulating layer 16B there the interconnection 18 is provided, a contact hole 19 is provided so as to expose the interconnection 18, by using photolithography technology and etching technology, for example. Then, when forming the first electrode 21 of the light emitting element 10, the first electrode 21 is formed so as to be in contact with the interconnection 18 via the contact hole 19. Thus, the first electrode 21 of the light emitting element 10 is electrically connected to a source/drain region 14B of the TFT 15 via the interconnection 18. The gate electrode 12 of the TFT 15 is connected to a scanning circuit (not shown). Each TFT 15 is driven by a current being applied to the TFT 15 from the scanning circuit at an appropriate timing, and each light emitting element 10 emits light so that desired images, characters, etc. are displayed as a whole. Various publicly known methods may be used as the method for driving the TFT 15 to obtain appropriate display (that is, the method for driving the display device 1), and hence a detailed description is omitted herein.

Note that, although in the above example the interlayer insulating layer 16 contains SiON, the present embodiment is not limited to this example. The interlayer insulating layer 16 may contain various publicly known materials that can be used as an interlayer insulating layer in a common organic EL display. For example, as the material contained in the interlayer insulating layer 16, $SiO_2$-based materials (for example, $SiO_2$, BPSG, PSG, BSG, AsSG, PbSG, SiON, spin-on glass (SOG), low melting point glass, a glass paste, and the like), SiN-based materials, and insulating resins (for example, a polyimide resin, a novolac-based resin, an acrylic-based resin, polybenzoxazole, and the like) may be used singly or in combination, as appropriate. Further, the method for forming the interlayer insulating layer 16 is not limited to the above example either, and publicly known methods such as the CVD method, the application method, the sputtering method, and various printing methods may be used for the formation of the interlayer insulating layer 16. Furthermore, although in the above example the interconnection 18 is formed by forming aluminum as a film and patterning the film by the vacuum vapor deposition method and the etching method, the present embodiment is not limited to this example. The interconnection 18 may be formed by forming, as a film, any of various materials that are used as an interconnection in a common organic EL display and patterning the film by various methods.

(Configuration of Parts Above Light Emitting Element)

The opening 25 provided in the second member 52 of the light emitting element 10 is formed so as to have a tapered shape in which the side wall of the opening 25 is inclined such that the opening area increases with proximity to the bottom. Then, a first member 51 is put in the opening 25. That is, the first member 51 is a layer that is provided immediately above the luminescence surface of the light emitting element 10 and that propagates emission light from the light emitting element upward. Further, by forming the opening 25 of the second member 52 in the above manner, a cross-sectional shape in the stacking direction of the first member 51 (that is, the illustrated cross-sectional shape) has a substantially trapezoidal shape, and thus the first member 51 has a truncated conical or pyramidal shape in which the bottom surface faces up.

The first member 51 is formed by forming $Si_{1-x}N_x$ as a film by the vacuum vapor deposition method so as to fill the opening 25, and then planarizing the surface of the $Si_{1-x}N_x$ film by the chemical mechanical polishing method (CMP method) or the like. However, the material of the first member 51 is not limited to this example, and various materials having insulating properties may be used as the material of the first member 51. Examples of the material contained in the first member 51 include $Si_{1-x}N_x$, ITO, IZO, $TiO_2$, $Nb_2O_5$, a bromine-containing polymer, a sulfur-containing polymer, a titanium-containing polymer, a zirconium-containing polymer, etc. The method for forming the first member 51 is not limited to this example either, and various publicly known methods may be used as the method for forming the first member 51.

However, in the present embodiment, the materials of the first member 51 and the second member 52 are selected such that the refractive index $n_1$ of the first member 51 and the refractive index $n_2$ of the second member 52 satisfy the relation of $n_1 > n_2$. By selecting the materials of the first member 51 and the second member 52 such that the refractive indices satisfy the relation mentioned above, at least a part of the light that has propagated through the first member 51 is reflected at a surface of the second member 52 facing the first member 51. More specifically, the organic layer 23 and the second electrode 22 of the light emitting element 10 are formed between the first member 51 and the second member 52, and therefore at least a part of the light that has propagated through the first member 51 is reflected at the interface between the second member 52 and the organic layer 23. That is, the surface of the second member 52 facing the first member 51 functions as a light reflection section (reflector) 53.

In the present embodiment, the first member 51 is provided immediately above the luminescence surface of the light emitting element 10, as mentioned above. Then, the first member 51 has a truncated conical or pyramidal shape in which the bottom surface faces up, and therefore light emitted from the luminescence surface of the light emitting element 10 is reflected upward, which is the light emission direction, by the interface between the first member 51 and the second member 52, that is, the reflector 53. Thus, according to the present embodiment, the efficiency of extracting emission light from the light emitting element 10 can be improved by providing the reflector 53, and the luminance as the entire display device 1 can be improved.

Note that an investigation by the present inventors shows that, to improve the efficiency of extracting emission light from the light emitting element 10 more favorably, it is preferable that the refractive indices of the first member 51 and the second member 52 satisfy the relation of $n_1-n_2 \geq 0.20$. It is more preferable that the refractive indices of the first member 51 and the second member 52 satisfy the relation of $n_1-n_2 \geq 0.30$. Furthermore, to further improve the efficiency of extracting emission light from the light emitting element 10, it is preferable that the shape of the first member 51 satisfy the relations of $0.5 \leq R_1/R_2 \leq 0.8$ and $0.5 \leq H/R_1 \leq 0.8$. Here, $R_1$ represents the diameter of the light incidence surface of the first member 51 (that is, a surface facing down in the stacking direction and facing the luminescence surface of the light emitting element 10). $R_2$ represents the diameter of the light emitting surface of the first member 51 (that is, a surface facing up in the stacking direction), and H represents the distance between the bottom surface and the upper surface (the height in the stacking direction) in a case where the first member 51 is regarded as a truncated cone or pyramid.

A protection film 31 and a planarizing film 32 are stacked in this order on the planarized first member 51. The protection film 31 is formed by, for example, stacking $Si_{1-y}N_y$ with a prescribed film thickness (approximately 3.0 μm) by the vacuum vapor deposition method. Further, the planarizing film 32 is formed by, for example, stacking $SiO_2$ with a prescribed film thickness (approximately 2.0 μm) by the CVD method and planarizing the surface by the CMP method or the like.

However, the materials and the film thicknesses of the protection film 31 and the planarizing film 32 are not limited to these examples, and the protection film 31 and the planarizing film 32 may contain various publicly known materials used as a protection film and a planarizing film of a common organic EL display so as to have film thicknesses commonly employed in an organic EL display, as appropriate.

However, in the present embodiment, it is preferable that the material of the protection film 31 be selected such that the refractive index $n_3$ of the protection film 31 is equal to the refractive index $n_1$ of the first member 51 or smaller than the refractive index $n_1$ of the first member 51. Furthermore, the materials of the protection film 31 and the planarizing film 32 are selected such that the absolute value of the difference between the refractive index $n_3$ of the protection film 31 and the refractive index $n_4$ of the planarizing film 32 is preferably less than or equal to 0.30 and more preferably less than or equal to 0.20. By thus selecting the materials of the protection film 31 and the planarizing film 32, the reflection or scattering of emission light from the light emitting element 10 at the interface between the first member 51 and the protection film 31 and the interface between the protection film 31 and the planarizing film 32 can be suppressed, and light extraction efficiency can be further improved.

Note that, as the configuration from the first substrate 11 to the protection film 31 of the display device 1, particularly as the configuration of the reflector 53, the configuration of a display device disclosed in JP 2013-191533A, which is a prior application by the present applicant, may be used, for example.

The CF layer 33 is formed on the planarizing film 32. Thus, the display device 1 is a display device of what is called an on-chip color filter (OCCF) system in which the CF layer 33 is formed on the first substrate 11 on which the light emitting element 10 is formed. The second substrate 34 is stuck to the upper side of the CF layer 33 via, for example, a sealing resin film 35 of an epoxy resin or the like, and thereby the display device 1 is fabricated. Note that the material of the sealing resin film 35 is not limited to this example, and the material of the sealing resin film 35 may be selected in view of high transmissivity to the emission light from the light emitting element 10, excellence in adhesiveness to the CF layer 33 located on the lower side and the second substrate 34 located on the upper side, low reflectivity of light at the interface with the CF layer 33 located on the lower side and the interface with the second substrate 34 located on the upper side, etc., as appropriate.

The CF layer 33 is formed such that a CF of each color having a prescribed area is provided for each of the light emitting elements 10. The CF layer 33 may be formed by performing exposure on a resist material into a prescribed configuration and performing development by photolithography technology, for example. Further, the film thickness of the CF layer 33 is approximately 2 μm, for example. However, the material, the formation method, and the film thickness of the CF layer 33 are not limited to these examples, and the CF layer 33 may be formed so as to have a film thickness commonly employed in an organic EL display by using various publicly known materials that are used as a CF layer of a common organic EL display and various publicly known methods, as appropriate.

In the illustrated example, the CF layer 33 is provided such that a red CF 33R, a green CF 33G, and a blue CF 33B each having a prescribed area are continuously distributed in the horizontal plane. Note that, in the following description, in a case where there is no need to particularly distinguish the CF 33R, the CF 33G, and the CF 33B, one or a plurality of these may be written as simply a CF 33a.

One pixel is formed by a combination of one light emitting element 10 and one CF 33a. Note that, in practice, in the display device 1, one pixel may include sub-pixels of four colors, namely, a pixel in which the CF 33R is provided (that is, a red pixel), a pixel in which the CF 33G is provided (that is, a green pixel), a pixel in which the CF 33B is provided (that is, a blue pixel), and a pixel in which the CF 33a is not provided (that is, a white pixel). However, in the present specification, also a combination of one light emitting element 10 and one CF 33a is referred to as simply a pixel, for convenience of description. Further, in the display device 1, sub-pixels of four colors may be arranged in what is called a delta arrangement (see also FIG. 6 described later).

Here, in a common display device, a light emitting element and the CF corresponding to the light emitting element are arranged such that the center of the luminescence surface of the light emitting element and the center of the CF in the horizontal plane substantially coincide. On the other hand, in the display device 1 according to the present embodiment, a light emitting element 10 and the CF 33a corresponding to the light emitting element 10 are arranged such that the positions of the center of the luminescence surface of the light emitting element 10 and the center of the CF 33a are relatively shifted by a prescribed distance L in the horizontal plane, in at least a partial region in the display surface. In the illustrated example, the center of the CF 33a corresponding to the light emitting element 10 is placed to be shifted relative to the center of the luminescence surface of the light emitting element 10 in the right direction of the drawing sheet.

Note that, in the following description, the relative misalignment in the horizontal plane between the center of the luminescence surface of a light emitting element 10 and the center of the CF 33a corresponding to the light emitting element 10 is referred to also as simply a relative misalignment between the light emitting element 10 and the CF 33a. Further, the amount of relative misalignment L and the misalignment direction of the CF 33a to the center of the luminescence surface of the light emitting element 10 in the horizontal plane in the relative misalignment between the light emitting element 10 and the CF 33a are referred to also as simply the amount of misalignment L of the CF 33a and the misalignment direction of the CF 33a, respectively.

Figure 3:
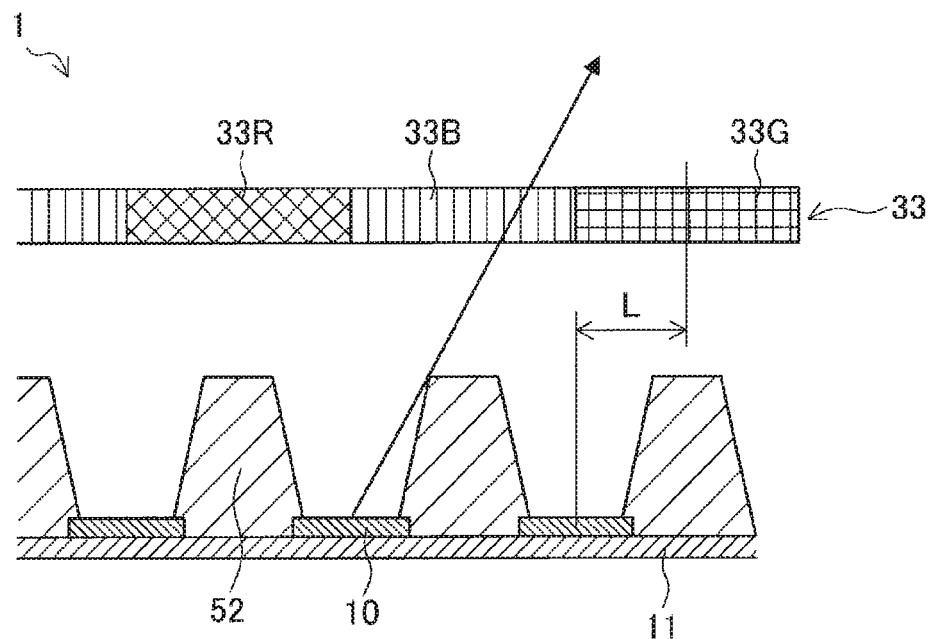
FIG. 3 is a diagram for describing an effect exhibited by creating a relative misalignment between a light emitting element and a CF in a display device according to the present embodiment.
Figure 4:
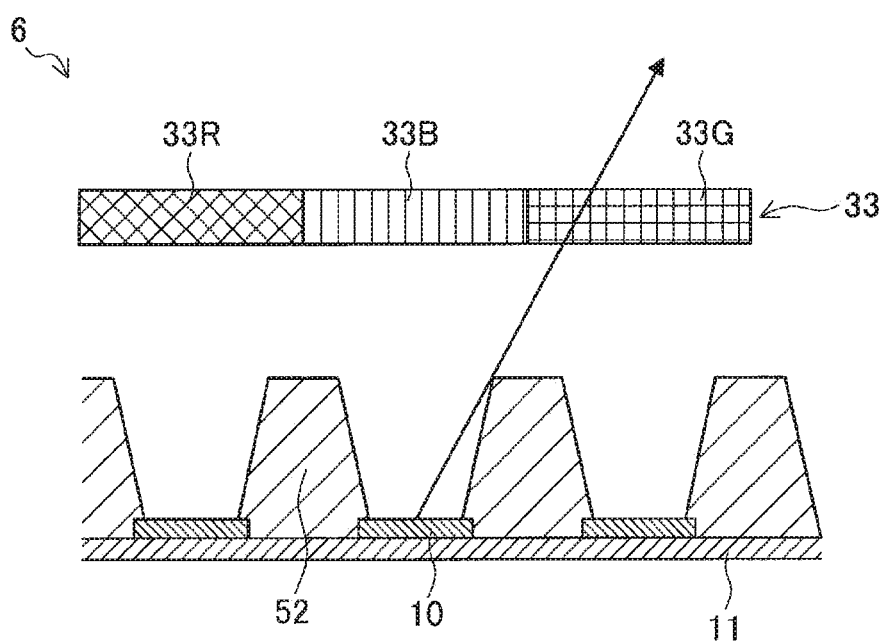
FIG. 4 is a diagram simply and schematically showing a configuration of a common display device.

FIG. 3 is a diagram for describing an effect exhibited by creating a relative misalignment between the light emitting element 10 and the CF 33a in the display device 1 according to the present embodiment. In FIG. 3, the cross section of the display device 1 shown in FIG. 2 is simplified, and only the first substrate 11, the light emitting element 10, the second member 52, and the CF layer 33 are shown. Further, FIG. 4 is a diagram for comparison, and is a diagram simply and schematically showing the configuration of a common display device 6. The common display device 6 shown in FIG. 4 has a similar configuration to the display device 1 according to the present embodiment except that a relative misalignment between the light emitting element 10 and the CF 33a is not created (that is, the center of the luminescence surface of a light emitting element and the center of the CF corresponding to the light emitting element in the horizontal plane substantially coincide).

In FIG. 3 and FIG. 4, the travel direction of light emitted from a certain light emitting element 10 at a certain angle is simulatively shown by an arrow. Here, it is assumed that it is intended to obtain blue light as light from the pixel that the focused-on light emitting element 10 falls under. In this case, as shown in FIG. 3, in the configuration according to the present embodiment, the light emitted from the certain light emitting element 10 at the certain angle passes through the CF 33B and is emitted from the display device 1, due to the fact that the relative position of the CF 33a to the light emitting element 10 is shifted by an amount of misalignment L in the horizontal plane. Therefore, desired blue light can be obtained. On the other hand, as shown in FIG. 4, in the common configuration, the light emitted from the certain light emitting element 10 at the certain angle does not pass through the blue CF 33B, which is the CF that the light is originally intended to pass through, but passes through the green CF 33G of an adjacent pixel. Therefore, color mixing occurs, and desired blue light cannot be obtained. Thus, it can be said that, by the configuration according to the present embodiment, the blue pixel including the certain light emitting element 10 has a wider viewing angle in the right direction of the drawing sheet, which is the misalignment direction of the CF 33B.

Thus, in the present embodiment, a relative misalignment between the light emitting element 10 and the CF 33a is created for a pixel, and thereby the viewing angle characteristics of the pixel in the misalignment direction of the CF 33a can be improved.

Here, the viewing angle characteristics required of pixels vary in accordance with the position in the display surface of the display device 1. Therefore, in the present embodiment, the amount of misalignment L and the misalignment direction of the CF 33a in each pixel are set such that a desired viewing angle is obtained in the pixel in accordance with the position of the light emitting element 10 (that is, the position of the pixel) in the display surface. That is, in the present embodiment, each of the amount of misalignment and the misalignment direction of the CF 33a has a distribution in the display surface.

Figure 5:
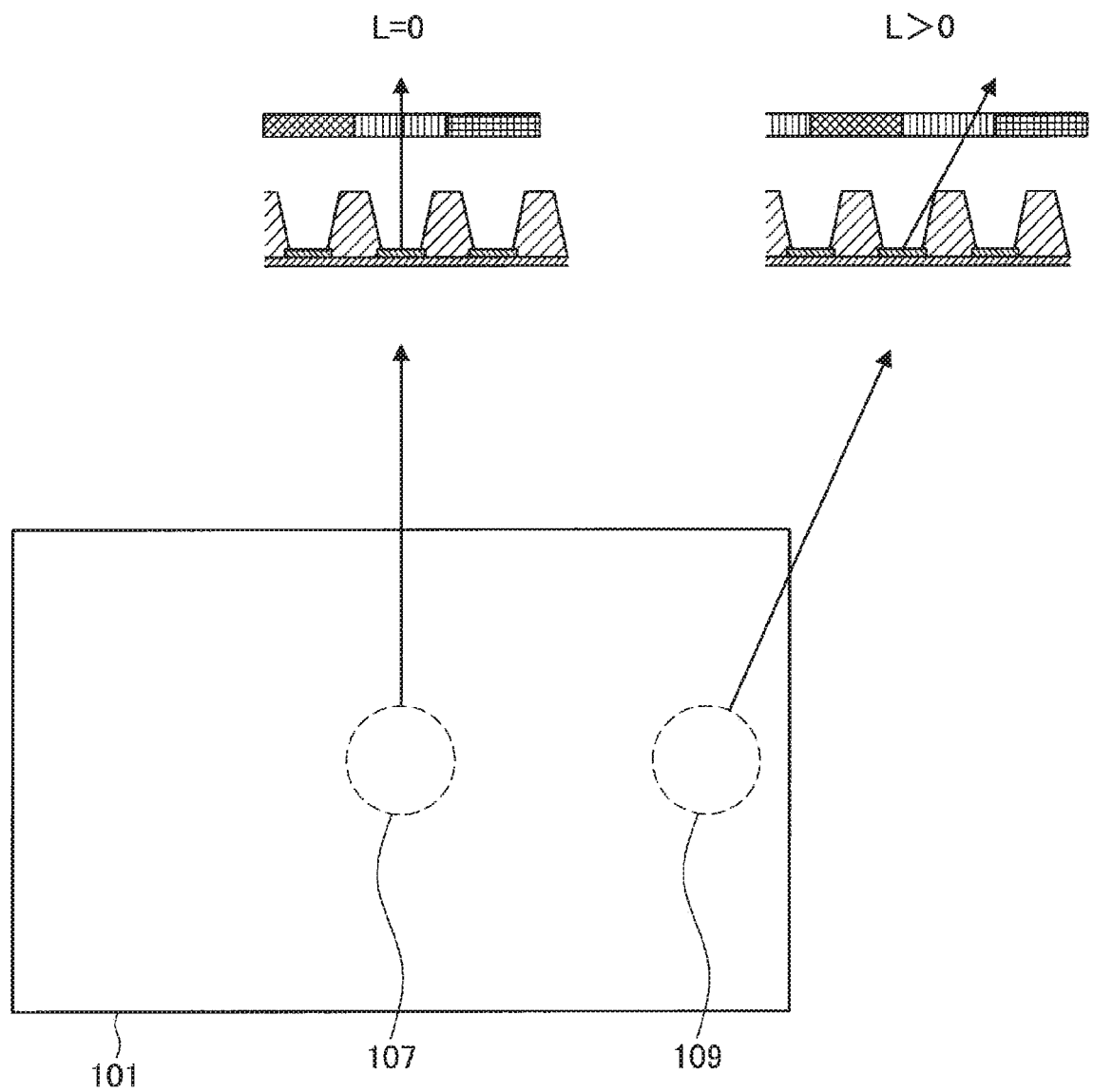
FIG. 5 is a diagram for describing distributions of amounts of misalignment L and misalignment directions of CFs in a display surface of a display device.

FIG. 5 is a diagram for describing distributions of amounts of misalignment L and misalignment directions of CFs 33a in the display surface of the display device 1. Here, a case where, when mounted on an electronic apparatus, the display device 1 is installed such that the display surface 101 faces the optical system 105 with a relatively narrow distance, as shown in FIG. 1, is envisaged. In this case, as shown in FIG. 5, for emission light from a pixel placed in region 107 that is substantially near the center in the display surface 101 of the display device 1, it is sufficient that emission light in a direction substantially perpendicular to the luminescence surface of the light emitting element 10 be incident on the optical system 105; hence, the emission light from a pixel placed in region 107 does not need to have considerably wide viewing angle characteristics. Therefore, in a pixel placed in region 107, the light emitting element 10 and the CF 33a are arranged such that a relative misalignment between the light emitting element 10 and the CF 33a is not created (that is, the amount of misalignment L is set to L=0), like in the common display device 6.

On the other hand, for emission light from a pixel placed in region 109 that is near the outer periphery in the display surface 101 of the display device 1, it is necessary that light emitted toward the outer edge of the display surface 101 be incident on the optical system 105; hence, the emission light from a pixel placed in region 109 needs to have wider viewing angle characteristics toward the outer edge of the display surface 101 (in the illustrated example, in the right direction of the drawing sheet). Therefore, in a pixel placed in region 109, the light emitting element 10 and the CF 33a are arranged such that a relative misalignment between the light emitting element 10 and the CF 33a is created by a prescribed amount of misalignment L (L>0), like in the configuration described with reference to FIG. 2 and FIG. 3. Further, in this event, the misalignment direction of the CF 33a is set to a direction from the center of the display surface 101 to the place where the pixel is located. Thereby, in a pixel placed in region 109, wider viewing angle characteristics are obtained toward the outer edge of the display surface 101.

FIG. 5 shows only the configuration of pixels in region 107 that is substantially near the center in the display surface 101 and region 109 that is near the outer periphery; however, in the present embodiment, pixels are provided in a gradational manner in accordance with the position in the display surface 101, that is, in such a manner that the amount of misalignment L of the CF 33a becomes larger as the position shifts from the center of the display surface 101 toward the outer edge. For example, the inside of the display surface 101 is divided into a plurality of regions, and the amount of misalignment L is set for each region in accordance with the position in the display surface 101 of the region. Further, also the misalignment direction of the CF 33a is set for each region. Here, in the present embodiment, the misalignment direction of the CF 33a is set simply to either one of the horizontal direction and the vertical direction of the display surface 101. By this configuration, the distribution of misalignment directions of CFs 33a in the plane of the display surface 101 can be managed more easily, thus, the design is not complicated.

Note that, in the above example, an arrangement of the display device 1 and the optical system 105 like that shown in FIG. 1 is envisaged, and hence pixels are provided such that the amount of misalignment L of the CF 33a becomes larger as the position shifts from the center of the display surface 101 toward the outer edge; but the present embodiment is not limited to this example. The way of division of regions, and the amount of misalignment L and the misalignment direction of the CF 33a in each region (that is, the distributions of amounts of misalignment L and misalignment directions of CFs 33a in pixels in accordance with the position in the display surface 101) may be set such that a desired viewing angle is obtained for each pixel in the display surface 101, in accordance with the positional relationship between the display device 1 and the optical system 105 in the electronic apparatus, as appropriate. Specifically, the misalignment direction of the CF 33a may be set to a direction in which a viewing angle is intended to be obtained in the horizontal plane (that is, the inclination direction from the direction perpendicular to the luminescence surface to the direction of a desired viewing angle). A specific method for setting the amount of misalignment L of the CF 33a is described in detail later in (3. With regard to amount of misalignment of CF) below.

Figure 6:
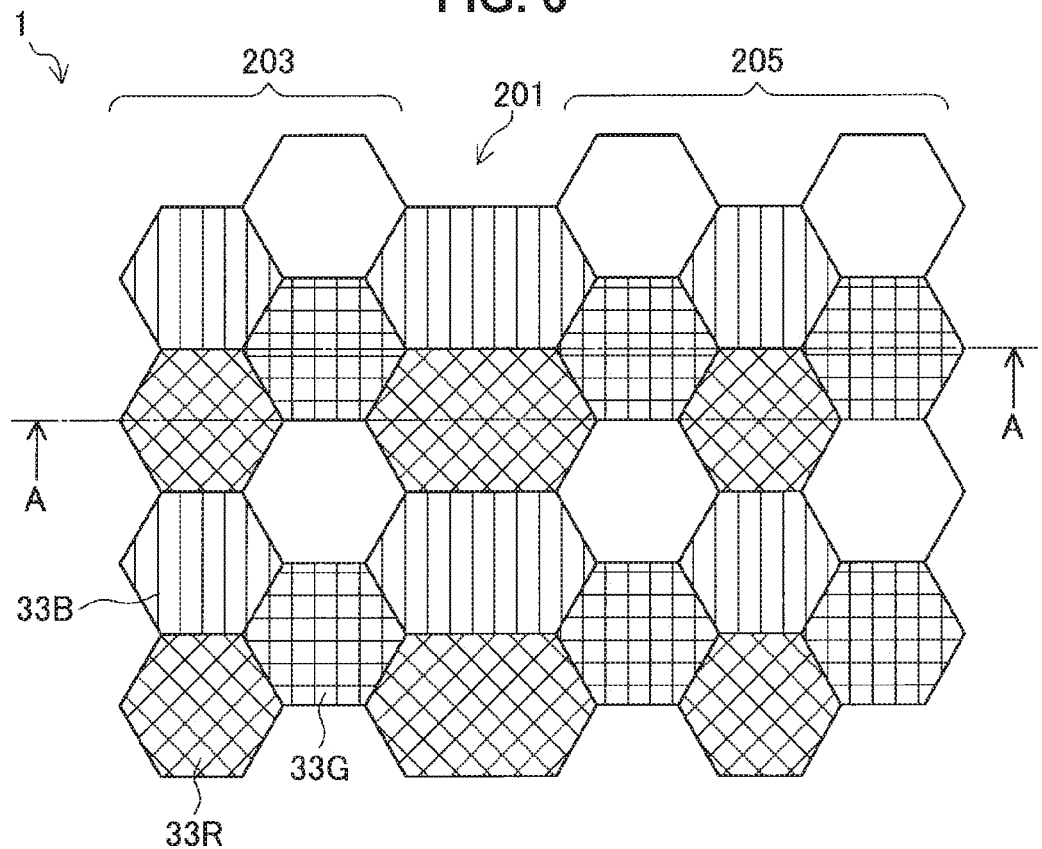
FIG. 6 is a diagram for describing a transition region in which the amount of misalignment L and/or the misalignment direction of the CF changes.
Figure 7:
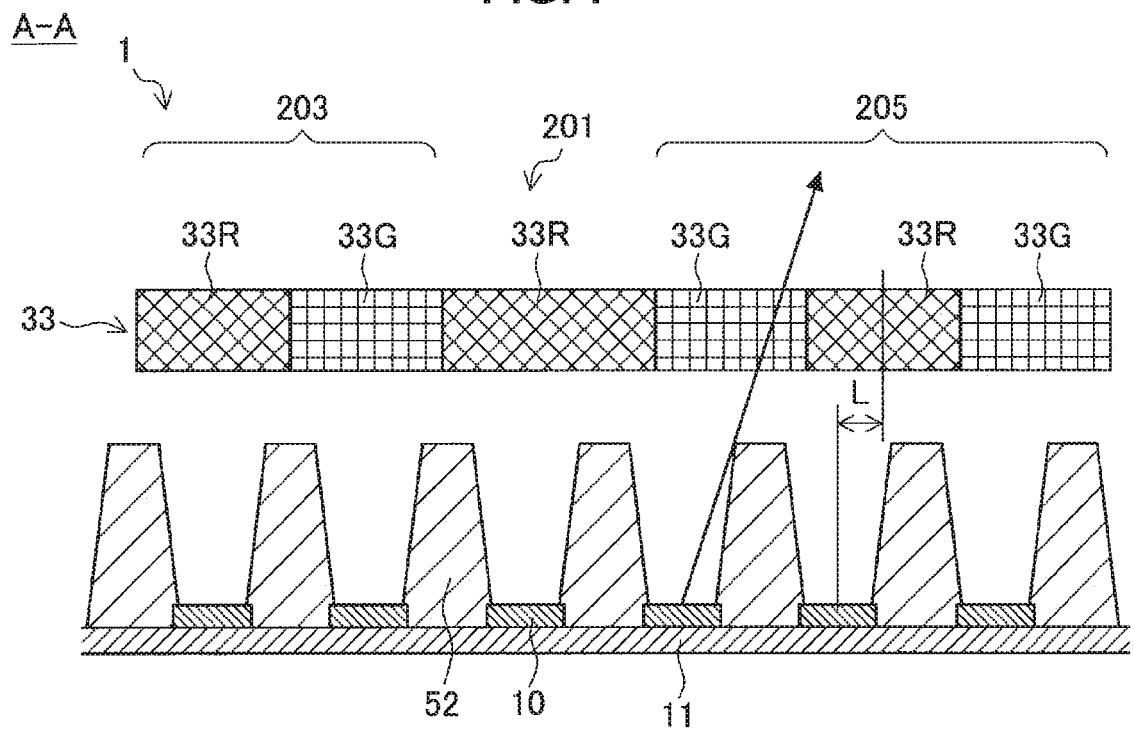
FIG. 7 is a diagram for describing a transition region in which the amount of misalignment L and/or the misalignment direction of the CF changes.

In order for the amount of misalignment L and/or the misalignment direction of the CF 33a to be changed between regions, a transition region in which the amount of misalignment L and/or the misalignment direction of the CF 33a changes may be provided between regions. Specifically, the transition region is formed as a region in which the area of the CF 33a is different from the area of another CF 33a provided in a normal pixel. FIG. 6 and FIG. 7 are diagrams for describing a transition region in which the amount of misalignment L and/or the misalignment direction of the CF 33a changes. FIG. 6 and FIG. 7 schematically show the configuration of, in the display device 1, near the boundary between two regions between which the amount of misalignment L of the CF 33a is different. FIG. 6 is a top view, and shows an arrangement of CFs 33a. FIG. 7 is a side cross-sectional view, and shows a situation of a cross section corresponding to the A-A cross section shown in FIG. 6. Note that the region not hatched in FIG. 6 is a region corresponding to a white pixel in which the CF 33a is not provided. Further, in FIG. 7, the structure of the display device 1 shown in FIG. 2 is simplified, and only the first substrate 11, the light emitting element 10, the second member 52, and the CF layer 33 are shown, like in FIG. 3.

FIG. 6 and FIG. 7 show as an example, region 203 where the amount of misalignment L of the CF 33a=0, region 205 that is adjacent to region 203 and in which the amount of misalignment L of the CF 33a is a prescribed value that is not zero, and a transition region 201 provided between region 203 and region 205. As illustrated, the transition region 201 is formed as a region in which the area of the CF 33a is larger than the area of a normal CF 33a in another region. Further, the CF 33a located in the transition region 201 is formed such that the area of the CF 33a is increased on the misalignment side. Thereby, in region 205, the center of the CF 33a is placed to be shifted in the horizontal plane from the center of the luminescence surface of the light emitting element 10 by an amount of misalignment L>0 in the direction in which the area of the CF 33a located in the transition region 201 is increased. Also between not-shown other regions, the amount of misalignment L and/or the misalignment direction can be changed between regions by providing a similar transition region 201.

Note that, in the above example, the inside of the display surface 101 is divided into a plurality of regions, and the amount of misalignment L and the misalignment direction are set for each region in accordance with the position in the display surface 101 of the region; however, the present embodiment is not limited to this example. For example, the amount of misalignment L and the misalignment direction may be set not on a region basis but on a pixel basis, and the amount of misalignment L and the misalignment direction may be changed in a continuous manner between pixels in accordance with the position in the display surface 101 of the pixel. Also in this case, the amount of misalignment L and the misalignment direction of the CF 33a in each pixel may be set in accordance with the positional relationship between the display device 1 and the optical system 105 in the electronic apparatus in such a manner that a desired viewing angle is obtained for each pixel in the display surface 101, as appropriate.

Hereinabove, the configuration of the display device 1 according to the present embodiment is described. As described hereinabove, according to the present embodiment, the display device 1 has a configuration in which a relative misalignment between the light emitting element 10 and the CF 33a is created for each pixel in accordance with the position of the pixel in the display surface 101 of the display device 1 and the viewing angle required of the pixel. Therefore, according to the present embodiment, a display device 1 more excellent in viewing angle characteristics can be obtained without causing color mixing.

Further, in the present embodiment, since an improvement in viewing angle characteristics can be achieved by a relative misalignment between the light emitting element 10 and the CF 33a, there is no need to employ configurations that have been proposed until now for an improvement in viewing angle characteristics, such as those described in (1. Background with which present disclosure is conceived) above (for example, the narrowing of the facing gap and the downsizing of the area of the luminescence surface). Hence, the viewing angle characteristics can be improved without reducing the luminescence characteristics or the protectiveness of the light emitting element 10 (OLED), or causing a reduction in luminance.

Further, a relative misalignment between the light emitting element 10 and the CF 33a can be obtained by merely changing the configuration of CFs 33a during the formation of the CF layer 33, and therefore the display device 1 according to the present embodiment can be fabricated easily without increasing the number of manufacturing steps. Thus, desired effects can be obtained without increasing the production cost.

Further, in general, in a case where color shifting or color mixing has occurred, color correction processing may be performed by a driving circuit. According to the present embodiment, such color correction processing does not need to be performed because the occurrence of color shifting and color mixing can be suppressed favorably while the viewing angle characteristics are improved. Therefore, a driving circuit can be obtained more simply, and thus the circuit scale of the driving circuit can be made smaller.

Note that, although in the embodiment described hereinabove the misalignment direction of the CF 33a is set to only either one of the horizontal direction and the vertical direction of the display surface 101, the present embodiment is not limited to this example. For example, the misalignment direction of the CF 33a may be a two-dimensional arbitrary direction in the horizontal plane. By this configuration, the misalignment direction of the CF 33a can be set more finely for each pixel, and thus the adjustment of the viewing angle on a pixel basis can be performed more strictly.

Further, although in the embodiment described hereinabove the display device 1 is a display device of an OCCF system in which the CF layer 33 is formed on the first substrate 11, the present embodiment is not limited to this example. The display device 1 according to the present embodiment may be a display device of what is called a facing CF system that is fabricated by the CF layer 33 being formed on the second substrate 34, and the first substrate 11 and the second substrate 34 being stuck together such that the CF layer 33 faces the light emitting element 10.

Further, although in the embodiment described hereinabove the display device 1 has a configuration in which one pixel includes sub-pixels of four colors of a red pixel, a green pixel, a blue pixel, and a white pixel, the present embodiment is not limited to this example. Also in display devices having other pixel configurations, the effect of improving the viewing angle characteristics can be similarly obtained by creating a relative misalignment between the light emitting element 10 and the CF 33a in at least a partial region in the display surface.

Further, the method for arranging pixels in the display device 1 is not limited to the delta arrangement described above, either. For example, similar effects can be obtained also by other pixel arrangements such as a stripe arrangement, a diagonal arrangement, and a rectangle arrangement.

3. With Regard to Amount of Misalignment of CF

A method for setting the amount of misalignment L of the CF 33a will now be described. As described above, in the present embodiment, the amount of misalignment L of the CF 33a in a pixel is set in accordance with the viewing angle required of the pixel. In the following, with a focus on one pixel, a method for setting the amount of misalignment L of the CF 33a in the pixel in a case where the viewing angle required of the pixel is $\theta_0$ is described with reference to FIG. 8 to FIG. 11. FIG. 8 to FIG. 11 are diagrams for describing a method for setting the amount of misalignment L of the CF 33a. Each of FIG. 8 to FIG. 11 simulatively shows the luminescence section 24 of one light emitting element 10, one CF 33a provided to correspond to the light emitting element 10 (in the illustrated example, a CF 33R), and the display surface 101 of the display device 1.

As shown in FIG. 8 to FIG. 11, a case where the viewing angle of the focused-on pixel is $\theta_0$ means a case where, when emission light from the luminescence section 24 passes through the CF 33R and other medium layers (the first member 51, the protection film 31, the planarizing film 32, etc. described with reference to FIG. 2) and is emitted from the display surface 101, light is emitted in a direction at an angle of $\theta_0$ from the direction perpendicular to the display surface 101. Here, it is assumed that the medium layers other than the CF 33R contain a uniform material, for the sake of simplicity; if the refractive index of this material is denoted by $n_1$, the refractive index of the CF 33R is denoted by $n_2$, and the refractive index of an air layer on the outside of the display surface 101 is denoted by $n_0$, the emission angle $\theta_1$ of emission light from the luminescence section 24 (the angle of emission light with respect to the direction perpendicular to the luminescence surface of the luminescence section 24) when emission light from the display surface 101 has an angle of $\theta_0$ can be expressed by Mathematical Formula (1) below from the law of refraction.

[Math. 1]

$$\theta_1 = \arcsin\left(\frac{n_0 \sin(\theta_0)}{n_1}\right) \quad (1)$$

In other words, if light emitted from the luminescence section 24 at an emission angle of $\theta_1$ passes through the CF 33R and the other medium layers and travels, light with a viewing angle of $\theta_0$ is emitted from the display surface 101. Therefore, the amount of misalignment L of the CF 33R for obtaining light with a viewing angle of $\theta_0$ on the display surface 101 may be set as a such a value that light emitted from the luminescence section 24 at an emission angle of $\theta_1$ passes through the CF 33R and the other medium layers. Here, medium layers such as the first member 51 and the protection film 31 exist immediately above the luminescence section 24 as described with reference to FIG. 2, and emission light from the luminescence section 24 necessarily passes through these medium layers because of the structure; hence, there is no need to consider conditions for emission light from the luminescence section 24 to pass through these medium layers. Therefore, in the end, the amount of misalignment L of the CF 33R for obtaining light with a viewing angle of $\theta_0$ on the display surface 101 may be set as such a value that emission light with an emission angle of $\theta_1$ from the luminescence section 24 passes through the CF 33R. Thus, in the present embodiment, the amount of misalignment L of the CF 33R is set as such a value that emission light with an emission angle of $\theta_1$ from the luminescence section 24 is incident on the lower surface of the CF 33R

Figure 8:
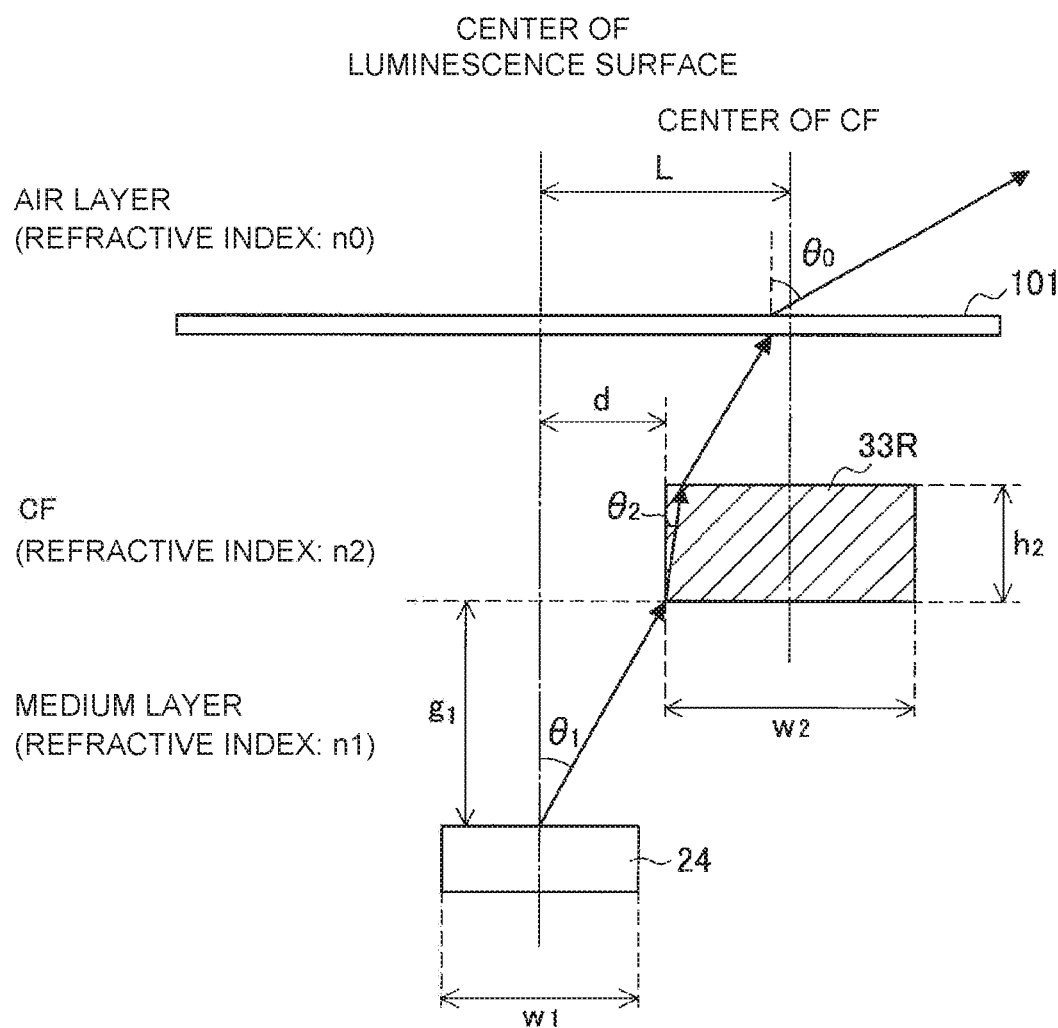
FIG. 8 is a diagram for describing a method for setting the amount of misalignment L of the CF.

First, it is assumed that light is emitted from one point of the center of the luminescence surface of the luminescence section 24, for the sake of simplicity; and the range of the amount of misalignment L of the CF 33R in this case is set. In this event, the case where the value of the amount of misalignment L of the CF 33R is largest is a case where emission light from the center of the luminescence surface of the luminescence section 24 is incident on an end of the lower surface of the CF 33R on a side near to the luminescence section 24. FIG. 8 shows the positional relationship between the luminescence section 24 and the CF 33R and the locus of a light beam in such a case where emission light from the center of the luminescence surface of the luminescence section 24 is incident on an end of the lower surface of the CF 33R on a side near to the luminescence section 24 (in the illustrated example, the left end). When the luminescence section 24 and the CF 33R are in the positional relationship shown in FIG. 8, the amount of misalignment L of the CF 33R can be expressed by Mathematical Formula (2) below from geometric consideration.

[Math. 2]

$$L = d + \frac{w_2}{2} \qquad (2)$$
$$= g_1\tan(\theta_1) + \frac{w_2}{2}$$

Here, the width of the CF 33R is denoted by $w_2$, the distance in the stacking direction from the surface of the luminescence section 24 to the lower surface of the CF 33R is denoted by $g_1$, and the distance in the horizontal plane from the luminescence position in the luminescence section 24 to the position where emission light is incident on the CF 33R is denoted by d.

Figure 9:
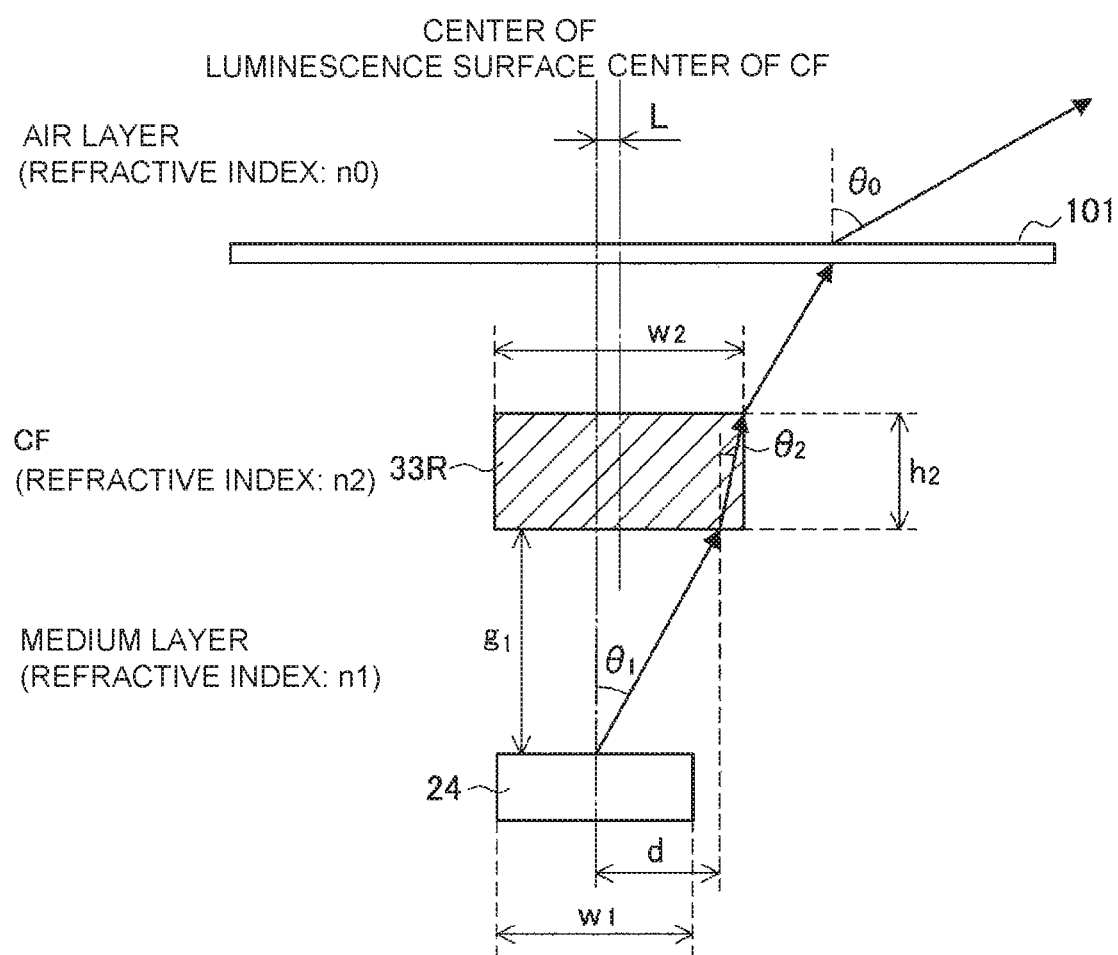
FIG. 9 is a diagram for describing a method for setting the amount of misalignment L of the CF.

On the other hand, in a case where it is assumed that light is emitted from one point of the center of the luminescence surface of the luminescence section 24, the case where the value of the amount of misalignment L of the CF 33R is smallest is a case where emission light from the center of the luminescence surface of the luminescence section 24 is incident on an end of the lower surface of the CF 33R on a side far from the luminescence section 24. FIG. 9 shows the positional relationship between the luminescence section 24 and the CF 33R and the locus of a light beam in such a case where emission light from the center of the luminescence surface of the luminescence section 24 is incident on an end of the lower surface of the CF 33R on a side far from the luminescence section 24 (in the illustrated example, the right end). When the luminescence section 24 and the CF 33R are in the positional relationship shown in FIG. 9, the amount of misalignment L of the CF 33R can be expressed by Mathematical Formula (3) below from geometric consideration.

[Math. 3]

$$L = d - \frac{w_2}{2} \qquad (3)$$
$$= g_1\tan(\theta_1) - \frac{w_2}{2}$$

From the above consideration, in a case where it is assumed that light is emitted from one point of the center of the luminescence surface of the luminescence section 24, if the amount of misalignment L of the CF 33R is set so as to satisfy Mathematical Formula (4) below, a viewing angle of $\theta_0$ can be obtained for emission light from the display surface 101.

[Math. 4]

$$g_1\tan(\theta_1) - \frac{w_2}{2} \leq L \leq g_1\tan(\theta_1) + \frac{w_2}{2} \qquad (4)$$

Figure 10:
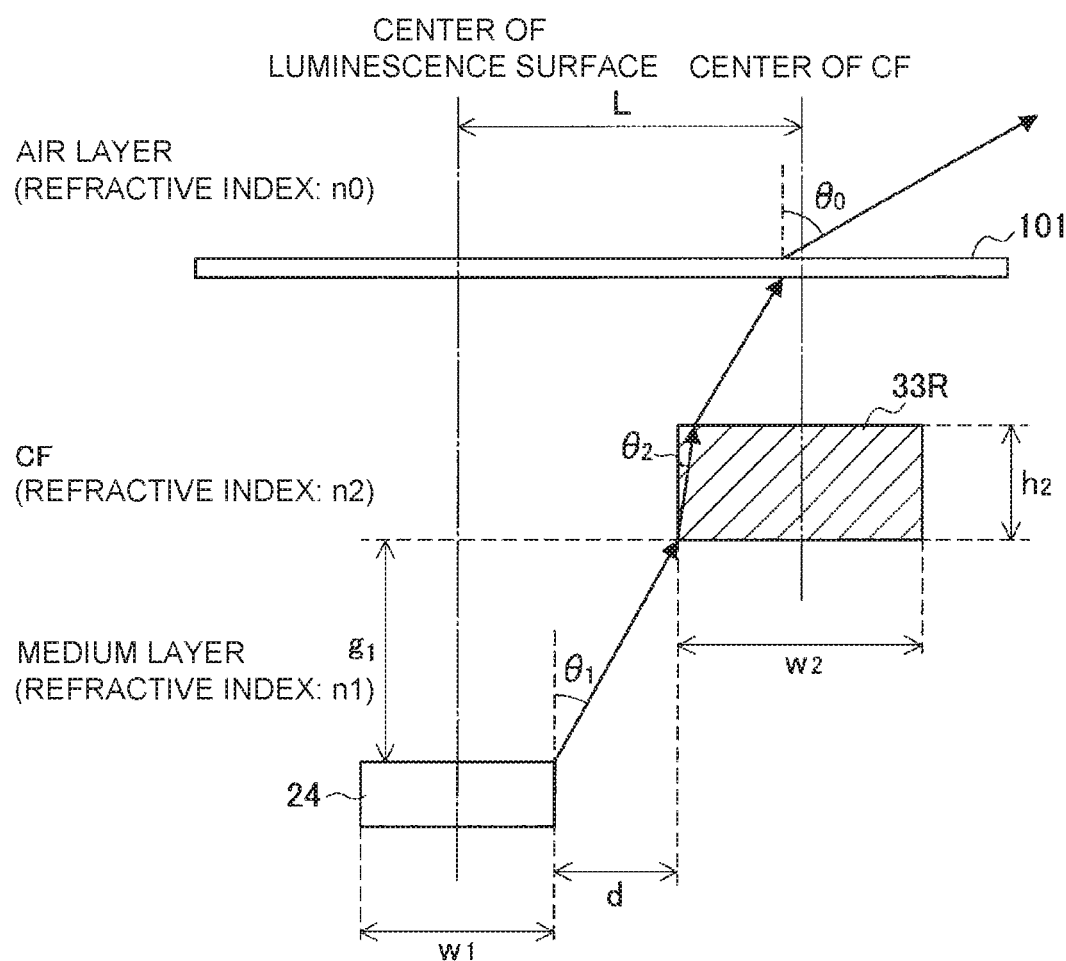
FIG. 10 is a diagram for describing a method for setting the amount of misalignment L of the CF.

However, in practice, light may be emitted from the luminescence section 24 also from areas other than the center of the luminescence surface of the luminescence section 24. Thus, next, the range of the amount of misalignment L of the CF 33R is set more finely by further taking into account luminescence positions in the luminescence surface of the luminescence section 24. In a case where luminescence positions in the luminescence surface of the luminescence section 24 are taken into account, the case where the value of the amount of misalignment L of the CF 33R is largest is a case where emission light from a luminescence position of the luminescence surface of the luminescence section 24 nearest to the CF 33R is incident on the lower surface of the CF 33R. FIG. 10 shows the positional relationship between the luminescence section 24 and the CF 33R and the locus of a light beam in such a case where emission light from a luminescence position of the luminescence surface of the luminescence section 24 nearest to the CF 33R (in the illustrated example, the right end) is incident on the lower surface of the CF 33R. Note that FIG. 10 shows, as an example, the positional relationship between the luminescence section 24 and the CF 33R and the locus of a light beam in a case where emission light from the luminescence section 24 is incident on an end of the lower surface of the CF 33R on a side near to the luminescence section 24 (in the illustrated example, the left end), like in the case shown in FIG. 8. When the luminescence section 24 and the CF 33R are in the positional relationship shown in FIG. 10, the amount of misalignment L of the CF 33R can be expressed by Mathematical Formula (5) below from geometric consideration. Here, the width of the luminescence section 24 is denoted by $w_1$.

[Math. 5]

$$L = d + \frac{w_2}{2} + \frac{w_1}{2} \qquad (5)$$
$$= g_1\tan(\theta_1) + \frac{w_2}{2} + \frac{w_1}{2}$$

Figure 11:
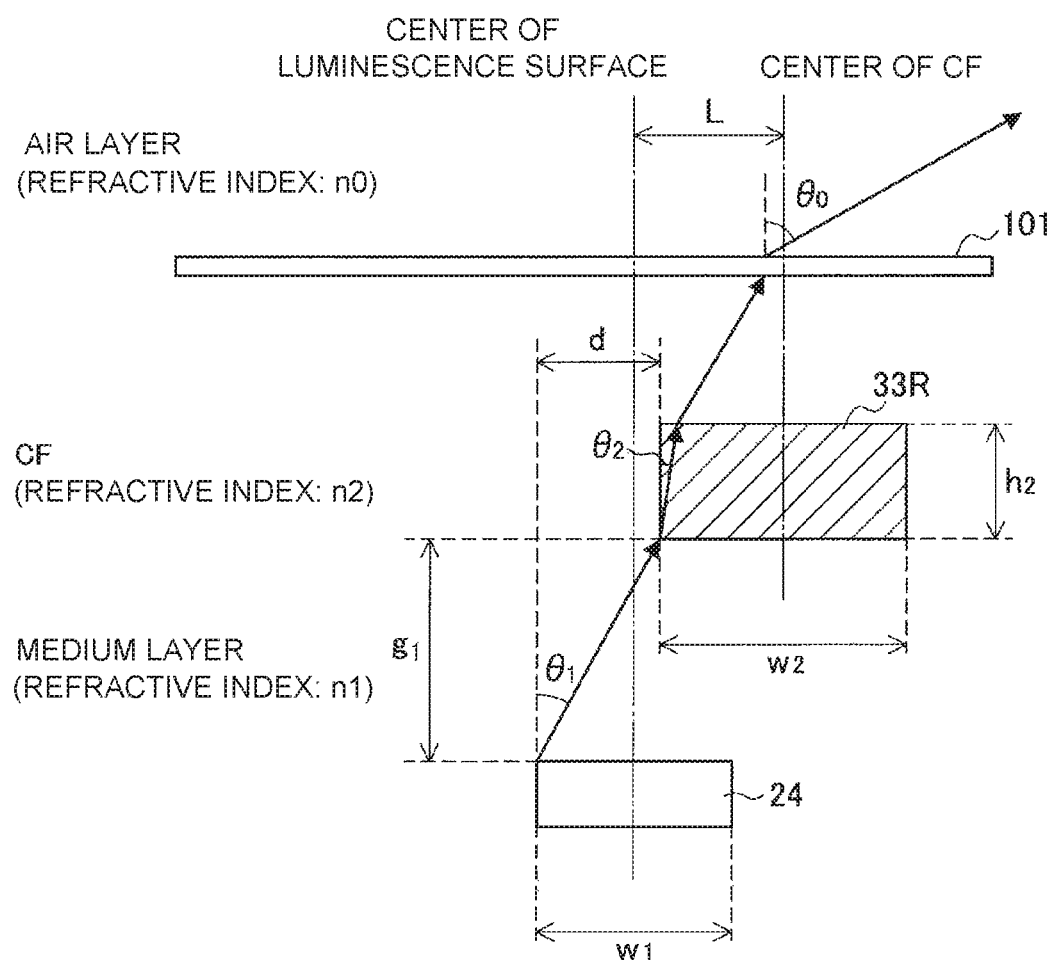
FIG. 11 is a diagram for describing a method for setting the amount of misalignment L of the CF.

On the other hand, in a case where luminescence positions in the luminescence surface of the luminescence section 24 are taken into account, the case where the value of the amount of misalignment L of the CF 33R is smallest is a case where emission light from a luminescence position of the luminescence surface of the luminescence section 24 farthest from the CF 33R is incident on the lower surface of the CF 33R. FIG. 11 shows the positional relationship between the luminescence section 24 and the CF 33R and the locus of a light beam in such a case where emission light from a luminescence position of the luminescence surface of the luminescence section 24 farthest from the CF 33R (in the illustrated example, the left end) is incident on the lower surface of the CF 33R. Note that FIG. 11 shows, as an example, the positional relationship between the luminescence section 24 and the CF 33R and the locus of a light beam in a case where emission light from the luminescence section 24 is incident on an end of the lower surface of the CF 33R on a side near to the luminescence section 24 (in the illustrated example, the left end), like in the case shown in FIG. 8. When the luminescence section 24 and the CF 33R are in the positional relationship shown in FIG. 11, the amount of misalignment L of the CF 33R can be expressed by Mathematical Formula (6) below from geometric consideration.

[Math. 6]

$$L = d + \frac{w_2}{2} - \frac{w_1}{2} \qquad (6)$$
$$= g_1\tan(\theta_1) + \frac{w_2}{2} - \frac{w_1}{2}$$

In FIG. 10 and FIG. 11 above, the case shown in FIG. 8 is envisaged, and the amount of misalignment L of the CF 33R in a case where emission light from the luminescence section 24 is incident on an end of the lower surface of the CF 33R on a side near to the luminescence section 24 is calculated; this similarly applies to the case shown in FIG. 9 where emission light from the luminescence section 24 is incident on an end of the lower surface of the CF 33R on a side far from the luminescence section 24. Therefore, in the end, the range of values that the amount of misalignment L of the CF 33R can take in order to obtain a viewing angle of $\theta_0$ for emission light from the display surface 101 can be expressed by Mathematical Formula (7) below; In other words, if the amount of misalignment L of the CF 33R is set so as to satisfy Mathematical Formula (7) below, a viewing angle of $\theta_0$ can be obtained for emission light from the display surface 101.

[Math. 7]

$$g_1 \tan(\theta_1) - \frac{w_2}{2} - \frac{w_1}{2} \le L \le g_1 \tan(\theta_1) + \frac{w_2}{2} + \frac{w_1}{2} \qquad (7)$$

Hereinabove, a method for setting the amount of misalignment L of the CF 33R is described. Note that, in the above example, medium layers are treated as a uniform material and the range that the amount of misalignment L of the CF 33a can take is calculated on the assumption that the refractive index of this material is $n_2$, for the sake of simplicity; in a case where it is attempted to find the range of the amount of misalignment L more strictly, the structure of an actual display device 1 like that shown in FIG. 2 may be envisaged, and a similar calculation may be performed while the refractive index of each layer is taken into account.

4. Modification Examples

Some modification examples of the embodiment described hereinabove will now be described.
(4-1. Methods for Creating Relative Misalignment Between Light Emitting Element and CF)

In the embodiment described above, in order to create a relative misalignment between the light emitting element 10 and the CF 33a, a transition region 201 in which the area of the CF 33a is different from the area of another normal CF 33a is provided in the CF layer 33, as described with reference to FIG. 6 and FIG. 7. However, in the present embodiment, the method for creating a relative misalignment between the light emitting element 10 and the CF 33a is not limited to the method mentioned above, and may be other methods.

Figure 12:
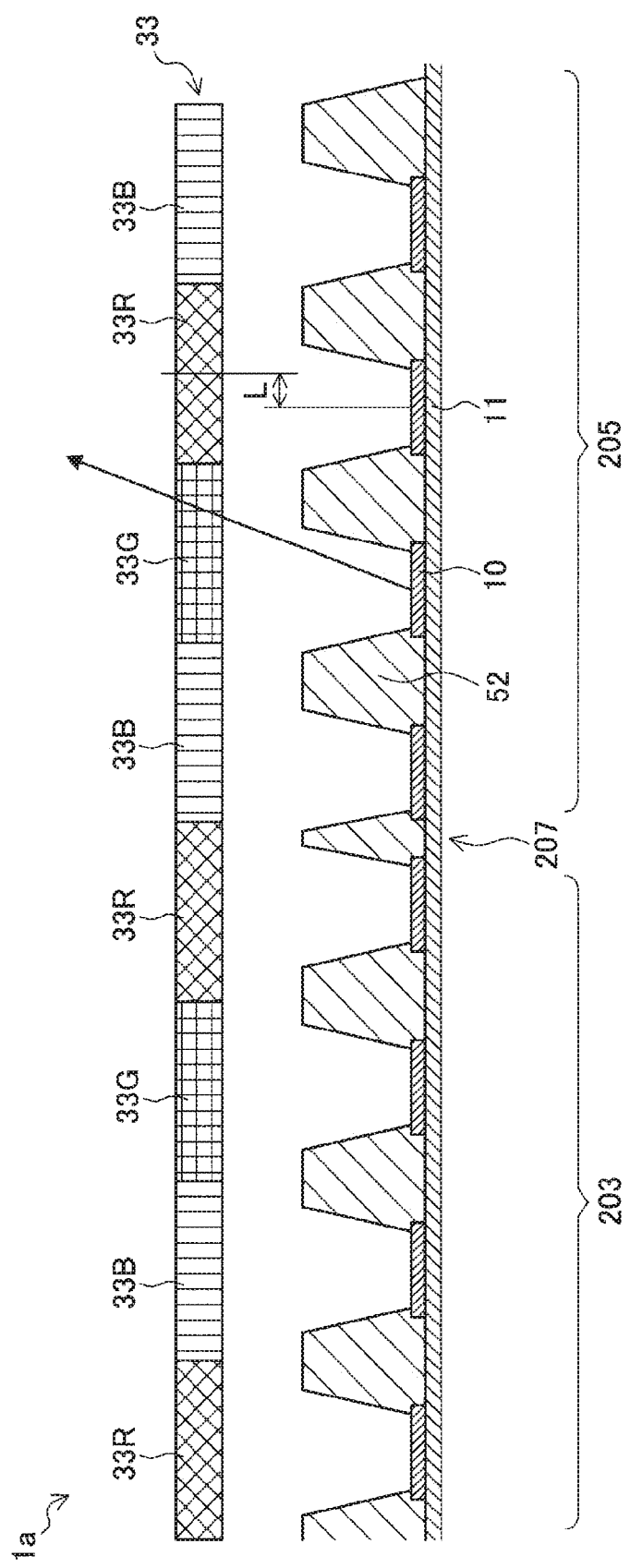
FIG. 12 is a diagram for describing another method for creating a relative misalignment between a light emitting element and a CF.

A modification example in which a relative misalignment between the light emitting element 10 and the CF 33a is created by another method will now be described with reference to FIG. 12. FIG. 12 is a diagram for describing another method for creating a relative misalignment between the light emitting element 10 and the CF 33a. In FIG. 12, like in FIG. 3 and FIG. 7, a cross-sectional structure in the stacking direction of a display device 1a according to the present modification example is simplified, and only the first substrate 11, the light emitting element 10, the second member 52, and the CF layer 33 are shown. Note that the display device 1a according to the present modification example has a similar configuration to the display device 1 according to the above embodiment except that the method for creating a relative misalignment between the light emitting element 10 and the CF 33a is different. Therefore, in the following description regarding the present modification example, matters different from the above embodiment are mainly described, and a detailed description of matters different from the above embodiment is omitted.

In the present modification example, like in the above embodiment, the inside of the display surface of the display device 1a is divided into a plurality of regions, and the amount of misalignment L and the misalignment direction may be set for each region in accordance with the position in the display surface of the region. FIG. 12 shows, as an example, region 203 in which the amount of misalignment L of the CF 33a=0, region 205 that is adjacent to region 203 and in which the amount of misalignment L of the CF 33a is a prescribed value that is not zero, and a transition region 207 provided between region 203 and region 205, similarly to FIG. 7. As illustrated, in the present modification example, the transition region 207 is formed as a region in which the pitch with which light emitting elements 10 are arranged (that is, the pixel spacing) is narrower than a normal pitch of another region. Further, in the transition region 207, the pixel spacing is adjusted such that the arrangement pitch of the light emitting element 10 is reduced on the misalignment side. Thereby, in region 205, the center of the CF 33a is placed to be shifted in the horizontal plane from the center of the luminescence surface of the luminescence section 24 by an amount of misalignment L>0 in the direction in which the arrangement pitch of the light emitting element 10 is reduced. Also between not-shown other regions, the amount of misalignment L and/or the misalignment direction can be changed between regions by providing a similar transition region 207.

Note that, also in the present modification example, the amount of misalignment L and the misalignment direction may be set not on a region basis but on a pixel basis, and the amount of misalignment L and the misalignment direction may be changed in a continuous manner between pixels in accordance with the position in the display surface of the pixel, like in the above embodiment. Further, the misalignment direction of the CF 33a may be only one of the horizontal direction and the vertical direction of the display surface 101, or may be a two-dimensional arbitrary direction in the horizontal plane.

Furthermore, as another method for creating a relative misalignment between the light emitting element 10 and the CF 33a, a region in which the CF 33a is not provided may be formed in the CF layer 33. For example, in a case where, like in the above embodiment, the inside of the display surface of the display device is divided into a plurality of regions, and the amount of misalignment L and the misalignment direction are set for each region in accordance with the position in the display surface of the region, a transition region between regions is formed as a region with a prescribed distance in which the CF 33a is not provided. For example, if a region in which the CF 33a is not provided is provided as a transition region by an amount of ⅓ of the arrangement pitch of the light emitting element 10, the center of the luminescence surface of the light emitting element 10 and the center of the CF 33a in the horizontal plane are shifted between before and after the transition region by ⅓ of the arrangement pitch of the light emitting element 10 in the direction in which the region in which the CF 33a is not provided is formed. That is, the amount of misalignment L and the misalignment direction can be changed between before and after the transition region.
(4-2. Configuration in which Reflector is not Provided)

In the embodiment described above, the reflector 53 is provided between pixels for luminance improvement (see FIG. 2). However, the present embodiment is not limited to this example, and the achievement of the object of improving the viewing angle characteristics does not necessarily requires the reflector 53 being provided.

Figure 13:
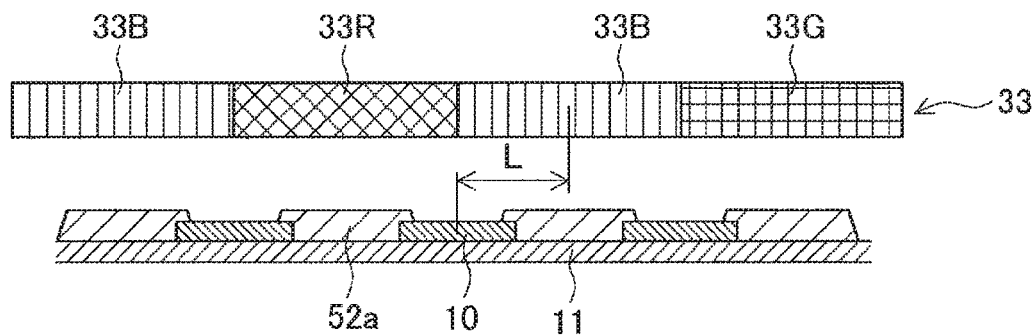
FIG. 13 is a diagram showing a configuration example of a display device according to a modification example in which a reflector is not provided.

A modification example in which such a reflector 53 is not provided will now be described with reference to FIG. 13. FIG. 13 is a diagram showing a configuration example of a display device 1b according to a modification example in which the reflector 53 is not provided. In FIG. 13, a cross-sectional structure in the stacking direction of the display device 1b according to the present modification example is simplified, and only the first substrate 11, the light emitting element 10, a second member 52a, and the CF layer 33 are shown, like in FIG. 3 and FIG. 7. Note that the display device 1b according to the present modification example has a similar configuration to the display device 1 according to the above embodiment except that the reflector 53 is not provided. Therefore, in the following description regarding the present modification example, matters different from the above embodiment are mainly described, and a detailed description of matters different from the above embodiment is omitted.

As shown in FIG. 13, in the display device 1b according to the present modification example, a second member 52a that is provided between pixels and functions as a pixel defining film that defines the pixel is provided in place of the second member 52 of the display device 1 according to the above embodiment. The second member 52a is formed as a layer having a thinner film thickness than the second member 52 in the above embodiment. Hence, the area of the side wall of the opening of the second member 52a, which is a region immediately above the luminescence section of the light emitting element 10, is not sufficiently ensured (that is, for a first member embedded in the opening of the second member 52a, relations like those described above are not sufficiently ensured for the height, or the area of the light incidence surface or the light emitting surface), and the surface of the second member 52a cannot function as a reflector. That is, the display device 1b is a display device in which a reflector is not provided.

Also in such a display device 1b in which a reflector is not provided, by creating a relative misalignment between the light emitting element 10 and the CF 33a, wide viewing angle characteristics can be improved for the pixel including the light emitting element in the direction in which the CF 33a is shifted relatively, like in the above embodiment. That is, similar effects to the above embodiment can be obtained.

(4-3. Other Methods for Setting Amount of Misalignment L)

As described in (3. With regard to amount of misalignment of CF) above, in the embodiment described above, the amount of misalignment L of the CF 33a is set by prescribing conditions where emission light from the luminescence section 24 is incident on the lower surface of the CF 33R. However, the present embodiment is not limited to this example. For example, it is presumed that, depending on the characteristics of emission light from the luminescence section 24, the characteristics of the CF 33a, etc., color conversion will be performed appropriately and light of desired characteristics can be emitted from the display surface 101 even in a case where emission light from the luminescence section 24 is incident on the side surface of the CF 33a. Thus, the amount of misalignment L of the CF 33a may be set taking into account also a case where emission light from the luminescence section 24 is incident on the side surface of the CF 33a.

Figure 14:
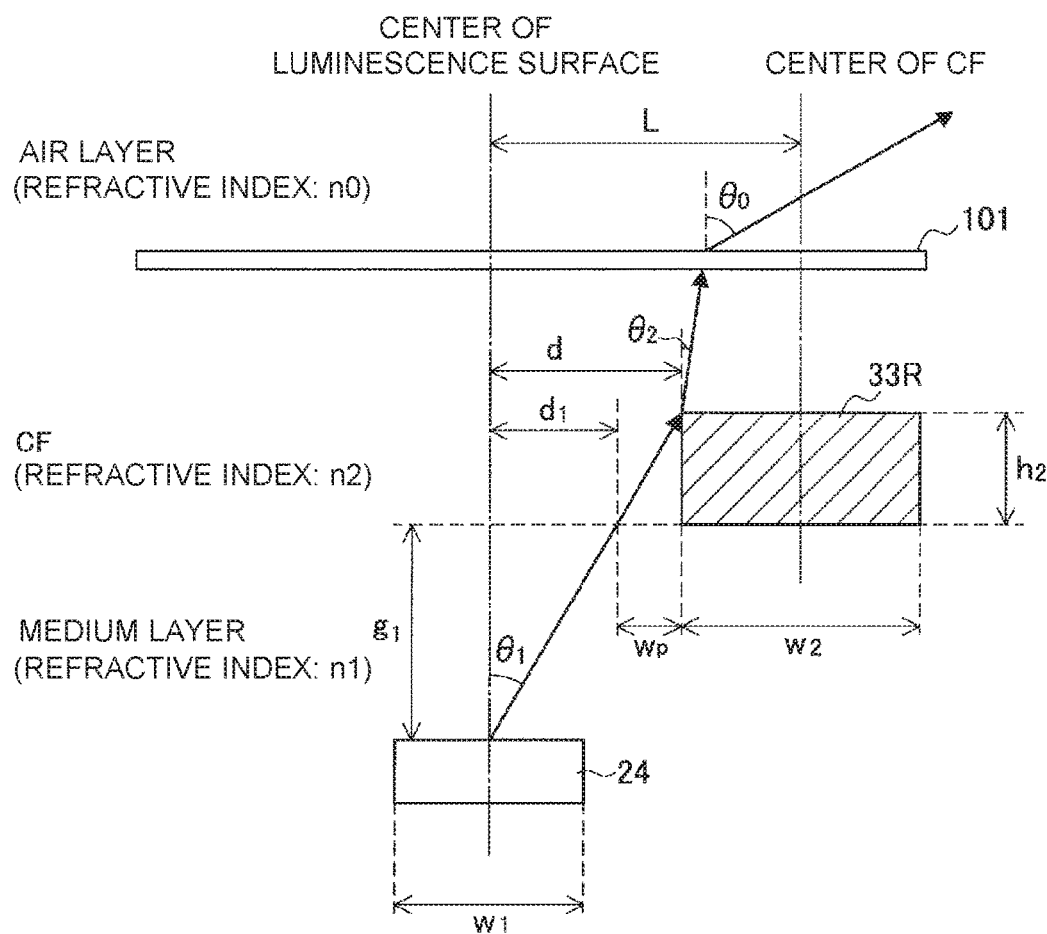
FIG. 14 is a diagram for describing a method for setting the amount of misalignment L of the CF taking into account also a case where emission light from a luminescence section is incident on a side surface of the CF.

Such a modification example in which the amount of misalignment L of the CF 33a is set taking into account also a case where emission light from the luminescence section 24 is incident on the side surface of the CF 33a will now be described with reference to FIG. 14. FIG. 14 is a diagram for describing a method for setting the amount of misalignment L of the CF 33a taking into account also a case where emission light from the luminescence section 24 is incident on the side surface of the CF 33a. Similarly to FIG. 8 to FIG. 11, FIG. 14 simulatively shows the luminescence section 24 of one light emitting element 10 provided in a display device according to the present modification example, one CF 33a provided to correspond to the light emitting element 10 (in the illustrated example, a CF 33R), and the display surface 101 of the display device. Further, medium layers are treated as layers containing a uniform material with a refractive index of $n_2$.

Herein, it is assumed that light is emitted from one point of the center of the luminescence surface of the luminescence section 24, for the sake of simplicity. In this event, in a case where emission light from the luminescence section 24 is incident on the side surface of the CF 33a, the case where the value of the amount of displacement L of the CF 33R is largest is a case where emission light from the luminescence section 24 is incident on the vicinity of the upper end of the side surface of the CF 33a. Herein, a case where emission light from the luminescence section 24 is incident on the upper end of the side surface of the CF 33a is assumed for the sake of simplicity. FIG. 14 shows the positional relationship between the luminescence section 24 and the CF 33R and the locus of a light beam in such a case where emission light from the luminescence section 24 is incident on the upper end of the side surface of the CF 33R. When the luminescence section 24 and the CF 33R are in the positional relationship shown in FIG. 14, the amount of misalignment L of the CF 33R can be expressed by Mathematical Formula (8) below from geometric consideration.

[Math. 8]

$$L = d + \frac{w_2}{2} \qquad (8)$$
$$= d_1 + w_p + \frac{w_2}{2}$$
$$= g_1 \tan(\theta_1) + h_2 \tan(\theta_1) + \frac{w_2}{2}$$

Here, the thickness of the CF 33R is denoted by $h_2$; within the distance d in the horizontal plane from the luminescence position in the luminescence section 24 to the position where emission light is incident on the CF 33R, the length of a portion corresponding to the distance $g_1$ in the stacking direction from the surface of the luminescence section 24 to the lower surface of the CF 33R is denoted by $d_1$; and within the distance d, the length of a portion corresponding to the thickness $h_2$ of the CF 33R is denoted by $w_p$.

Thus, the upper limit value of the range that the amount of displacement L of the CF 33R can take is made larger by taking into account also a case where emission light from the luminescence section 24 is incident on the side surface of the CF 33a. In FIG. 14, it is assumed that light is emitted from one point of the center of the luminescence surface of the luminescence section 24; however, if also a case where light is emitted from other parts in the luminescence surface is taken into account like in the consideration in (3. With regard to amount of misalignment of CF) above, the range that the amount of displacement L of the CF 33R can take can be expressed by Mathematical Formula (9) below, in the end. In other words, in the present modification example, if the amount of misalignment L of the CF 33R is set so as to satisfy Mathematical Formula (9) below, a viewing angle of $\theta_0$ can be obtained for emission light from the display surface 101. Note that, in practice, if emission light from the luminescence section 24 is not incident on "the vicinity of the upper end" of the side surface of the CF 33a, the emission light does not pass through the CF 33a and color conversion is not performed appropriately; hence, in Mathematical Formula (9) below, a case where emission light from the luminescence section 24 is incident on "the upper end" of the side surface of the CF 33a, that is, a case where L is equal to the upper limit value is excluded.

[Math. 9]

$$g_1 \tan(\theta_1) - \frac{w_2}{2} - \frac{w_1}{2} \leq L \leq g_1 \tan(\theta_1) + h_2 \tan(\theta_1) + \frac{w_2}{2} + \frac{w_1}{2} \quad (9)$$

Note that, instead of analytically setting the amount of misalignment L as described hereinabove, an optimum amount of misalignment and an optimum misalignment direction of the CF 33a, and an optimum distribution of CFs 33a in the display surface may be found in a trial and error manner by repeatedly performing an optical simulation and an experiment using a sample fabricated on the basis of the simulation result, as another method for setting the amount of misalignment L of the CF 33a.

Hereinabove, some modification examples regarding the present embodiment are described. Note that the configurations that the display device according to the present embodiment can have and the configurations that the display devices according to the modification examples can have, which are described hereinabove, may be used in combination with each other within the extent of feasibility. For example, the methods described above may be combined in order to create a relative misalignment between the light emitting element 10 and the CF 33a, as appropriate.

5. Application Examples

Application examples of the display devices according to the embodiment and the modification examples described hereinabove will now be described. Herein, some examples of electronic apparatuses in which the display devices according to the embodiment and the modification examples described hereinabove can be used are described.

Figure 15:
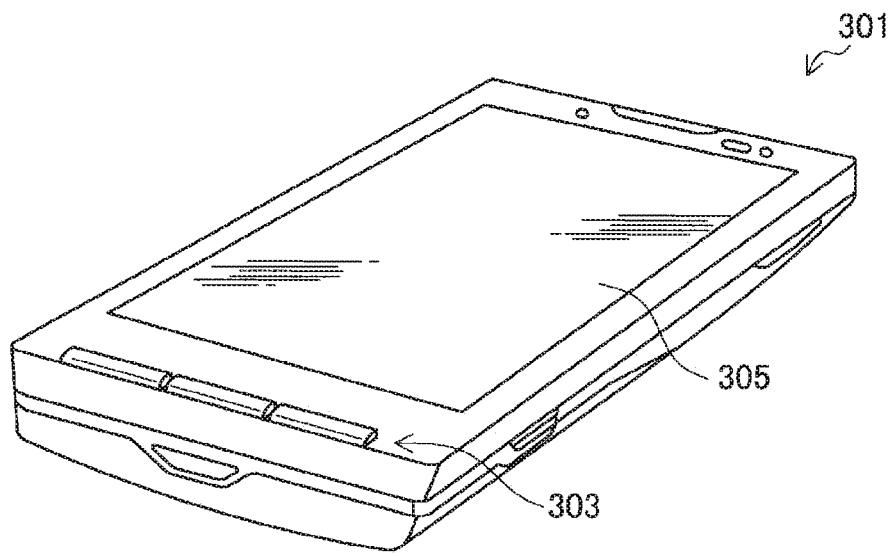
FIG. 15 is a diagram showing an external appearance of a smartphone that is an example of an electronic apparatus in which the display devices according to the present embodiment and the modification examples can be used.

FIG. 15 is a diagram showing an external appearance of a smartphone that is an example of the electronic apparatus in which the display devices according to the present embodiment and the modification examples can be used. As shown in FIG. 15, a smartphone 301 includes an operation section 303 that includes a button and accepts an operation input by the user and a display section 305 that displays various pieces of information. The display section 305 may include any of the display devices according to the present embodiment and the modification examples.

Figure 16:
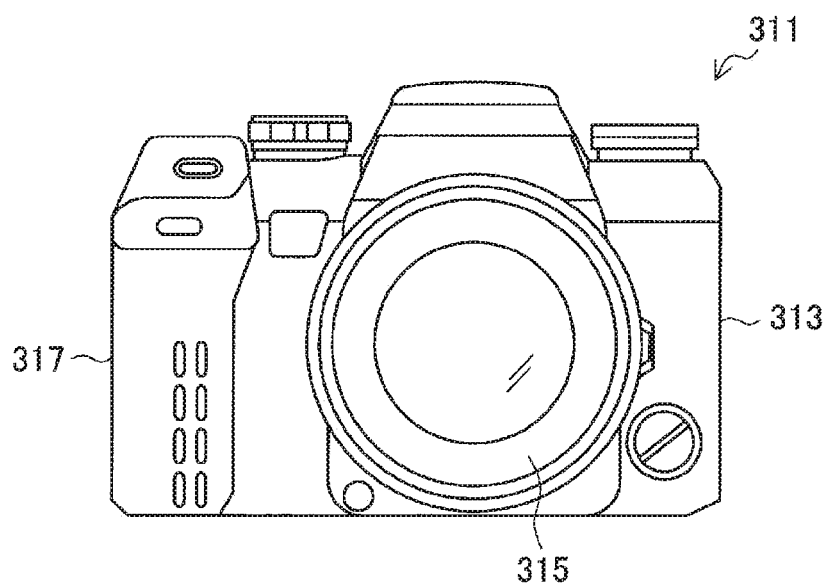
FIG. 16 is a diagram showing an external appearance of a digital camera that is another example of an electronic apparatus in which the display devices according to the present embodiment and the modification examples can be used.
Figure 17:
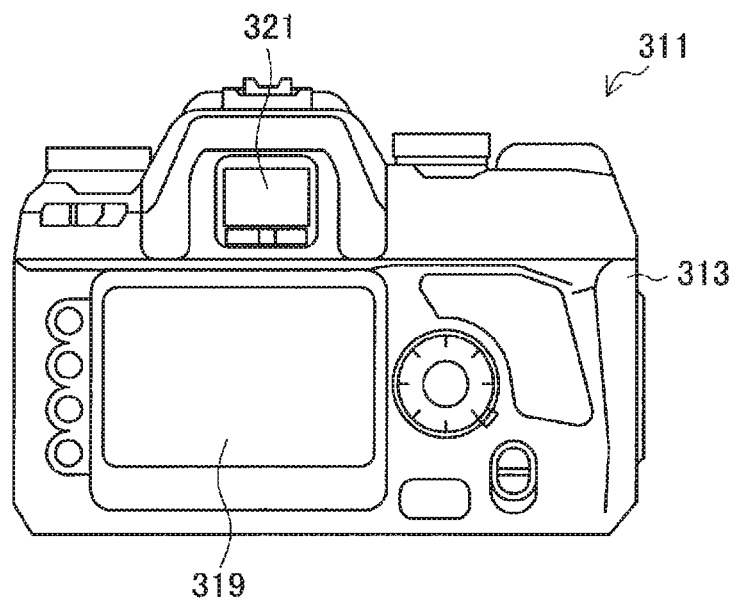
FIG. 17 is a diagram showing an external appearance of a digital camera that is another example of an electronic apparatus in which the display devices according to the present embodiment and the modification examples can be used.

FIG. 16 and FIG. 17 are diagrams showing external appearances of a digital camera that is another example of the electronic apparatus in which the display devices according to the present embodiment and the modification examples can be used. FIG. 16 shows an external appearance of a digital camera 311 as seen from the front side (the subject side), and FIG. 17 shows an external appearance of the digital camera 311 as seen from the rear side. As shown in FIG. 16 and FIG. 17, the digital camera 311 includes a main body section (camera body) 313, a replaceable lens unit 315, a grip section 317 that is gripped by the user during photographing, a monitor 319 that displays various pieces of information, and an EVF 321 that displays a through image that is observed by the user during photographing. The monitor 319 and the EVF 321 may include any of the display devices according to the present embodiment and the modification examples.

Figure 18:
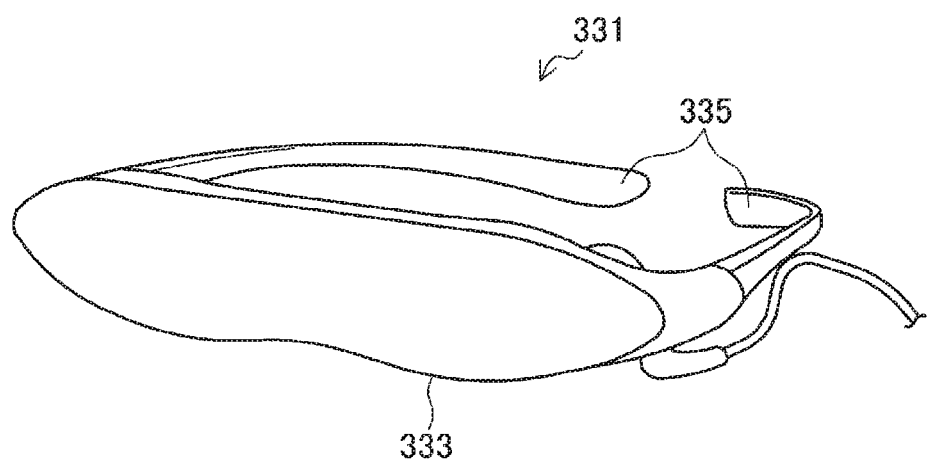
FIG. 18 is a diagram showing an external appearance of an HMD that is another example of an electronic apparatus in which the display devices according to the present embodiment and the modification examples can be used.

FIG. 18 is a diagram showing an external appearance of an HMD that is another example of the electronic apparatus in which the display devices according to the present embodiment and the modification examples can be used. As shown in FIG. 18, an HMD 331 includes an eyeglass-type display section 333 that displays various pieces of information and ear-fixing sections 335 that are fixed to the user's ears during wearing. The display section 333 may include any of the display devices according to the present embodiment and the modification examples.

Hereinabove, some examples of the electronic apparatus in which the display devices according to the present embodiment and the modification examples can be used are described. Note that the electronic apparatus in which the display devices according to the present embodiment and the modification examples can be used is not limited to those described above as examples, and the display device can be used for display devices that are mounted on electronic apparatuses in all fields that perform display on the basis of an image signal inputted from the outside or an image signal generated in the inside, such as a television device, an electronic book, a PDA, a notebook PC, a video camera, an HMD, and a game apparatus.

Example

The following experiment was performed in order to verify the effect of improving the viewing angle characteristics by the display device 1 according to the present embodiment described above. In the experiment, a sample of a display device having a configuration similar to the configuration of the display device 1 according to the present embodiment shown in FIG. 2 was produced, the display device was actually driven, and differences in chromaticity in accordance with the viewing angle of light emitted from the display surface were measured. A configuration in which sub-pixels of four colors of red, green, blue, and white were combined as one pixel was used as a luminescence pixel (that is, three colors of red, green, and blue were used as CFs). The spacing between pixels each including sub-pixels of four colors was set to 6.8 μm. Further, the film thickness of the CF was set to 2 μm.

However, in the fabricated display device, a region in which a relative misalignment between the light emitting element and the CF was created by an amount of misalignment L was formed only in a part of the display surface by using a configuration similar to the configuration shown in FIG. 6 and FIG. 7; in the other regions, like in a common configuration, a relative misalignment between the light emitting element and the CF was not created, and the center of the luminescence surface of the light emitting element and the center of the CF in the horizontal plane were caused to substantially coincide (that is, the amount of misalignment L was set to L=0). In the present experiment, a desired viewing angle on the display surface was set to 30°, in the region mentioned above in which a relative misalignment between the light emitting element and the CF was created, the misalignment direction of the CF was set to the same direction as the direction in which the viewing angle mentioned above was intended to be obtained. Further, the amount of misalignment L in this region was set by the method described in (3. With regard to amount of misalignment of CF) above, taking into account the refractive index, thickness, etc. of each layer of the fabricated display device. Specifically, L=0.6 μm was used as a value satisfying Mathematical Formula (7) above.

The display device was actually driven, and the u'v' chromaticity point of each of red, green, and blue was measured for emission light from the display surface, using a spectrophotometer (CS-2000, manufactured by Konica Minolta, Inc.). The u'v' chromaticity point was measured in each of a position corresponding to a viewing angle of 30° for emission light from a region in which a relative misalignment between the light emitting element and the CF was created (a misalignment-created region), a position corresponding to a viewing angle of 30° for emission light from a region in which a relative misalignment between the light emitting element and the CF was not created (a misalignment-not-created region), and a position corresponding to a viewing angle of 0° for emission light from the misalignment-not-created region. The results are shown in Table 1 below.

TABLE 1

|  | Luminescent color | u' | v' |
|---|---|---|---|
| Misalignment-created region (L = 0.6 um) | Red | 0.39 | 0.54 |
| Measured point: a position corresponding | Green | 0.15 | 0.57 |
| to a viewing angle of 30° | Blue | 0.18 | 0.21 |
| Misalignment-not-created region (L = 0) | Red | 0.35 | 0.54 |
| Measured point: a position corresponding | Green | 0.15 | 0.56 |
| to a viewing angle of 30° | Blue | 0.18 | 0.32 |
| Misalignment-not-created region (L = 0) | Red | 0.39 | 0.54 |
| Measured point: a position corresponding | Green | 0.14 | 0.57 |
| to a viewing angle of 0° | Blue | 0.18 | 0.20 |

In Table 1 above, if attention is focused on the measurement values of the u'v' chromaticity point in the position corresponding to a viewing angle of 30° in the misalignment-created region, it can be seen that values substantially equal to the values of the u'v' chromaticity point in the position corresponding to a viewing angle of 0° in the misalignment-not-created region have been obtained. From this result, it can be seen that, by using the configuration according to the present embodiment, values of the u'v' chromaticity point equal to the values in a case where the display surface is viewed from the front have been obtained at a desired viewing angle, and an improvement in viewing angle characteristics has been achieved.

On the other hand, if the measurement values of the u'v' chromaticity point in the position corresponding to a viewing angle of 30° in the misalignment-not-created region and the u'v' chromaticity point in the position corresponding to a viewing angle of 0° in the misalignment-not-created region are compared, it can be seen that particularly the value of the v' chromaticity point of blue is greatly different by 0.12. It is generally said that, if the u'v' chromaticity point is changed by more than or equal to 0.05, a person can recognize a change in color; thus, this result shows that there is a possibility that the color of emission light from the misalignment-not-created region will be changed to such a degree that the user can clearly recognize a change between in a case where the viewing angle is 0° and in a case where it is 30°.

From the above results, it has been verified that the viewing angle characteristics can be improved by using the display device 1 according to the present embodiment.

6. Supplement

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

For example, although in the above an embodiment in which the display device is an organic EL display is described as an example of the present disclosure, the present disclosure is not limited to this example. The display device that is an object of the present disclosure may be various display devices as long as they are display devices that can achieve color display by using CFs, such as a liquid crystal display, a plasma display, and an electronic paper device. Also in these other display devices, similar effects to the embodiment described above can be obtained by arranging light emitting sections and CFs in such a manner that, in at least a partial region in the display surface, a relative misalignment between the center of the luminescence surface of a light emitting section and the center of the CF corresponding to the light emitting section is created in a plane perpendicular to the stacking direction. Here, the light emitting section is a part that is included in each pixel of the display device and that emits light toward the outside. For example, in an organic EL display like the embodiment described hereinabove, the light emitting section corresponds to a light emitting element. Further, for example in a liquid crystal display, the light emitting section corresponds to a region corresponding to one pixel of a liquid crystal panel. Further, for example in a plasma display, the light emitting section corresponds to a region corresponding to one discharge cell of a plasma display panel.

Further, the effects described in this specification are merely illustrative or exemplified effects, and are not limitative. That is, with or in the place of the above effects, the technology according to the present disclosure may achieve other effects that are clear to those skilled in the art from the description of this specification.

Additionally, the present technology may also be configured as below.

(1)

A display device including:
a plurality of light emitting sections formed on a substrate; and
a color filter provided on the light emitting section to correspond to each of the plurality of light emitting sections,
in which the light emitting sections and the color filters are arranged such that, in at least a partial region in a display surface, a relative misalignment between a center of a luminescence surface of the light emitting section and a center of the color filter corresponding to the light emitting section is created in a plane perpendicular to a stacking direction.

(2)

The display device according to (1),
in which areas of the plurality of color filters have a distribution in the display surface, and thereby the relative misalignment is created.

(3)

The display device according to (2),
in which a plurality of regions are set in the display surface and an area of a color filter located between adjacent ones of the regions is different from an area of another color filter, and thereby the relative misalignment is created with amounts of misalignment different from each other between regions.

(4)

The display device according to (2),
in which the areas of the plurality of color filters gradually change in the display surface, and thereby the relative misalignment is created.

(5)

The display device according to any one of (1) to (4),
in which a pitch with which the light emitting sections are arranged on the substrate is different in at least a partial region from the pitch in another region, and thereby the relative misalignment is created.

(6)

The display device according to any one of (1) to (5),
in which an amount of misalignment of the relative misalignment becomes larger with proximity to an outer edge of the display surface.

(7)

The display device according to any one of (1) to (6),
in which an amount of misalignment in the relative misalignment and a misalignment direction of the center of the color filter corresponding to the light emitting section with respect to the center of the luminescence surface of the light emitting section in the plane perpendicular to the stacking direction are set in accordance with a viewing angle required of a pixel including the light emitting section and the color filter in which the relative misalignment is created.

(8)

The display device according to any one of (1) to (7),
in which, in the relative misalignment, a misalignment direction of the center of the color filter corresponding to the light emitting section with respect to the center of the luminescence surface of the light emitting section in the plane perpendicular to the stacking direction is a direction from a center of the display surface toward a position where the light emitting section and the color filter in which the relative misalignment is created exist in the display surface.

(9)

The display device according to any one of (1) to (8), further including:
a first member provided immediately above the light emitting section, having a substantially truncated conical or pyramidal shape in which a cross-sectional area in an in-plane direction perpendicular to the stacking direction gradually increases with proximity to a top, and configured to propagate emission light from the light emitting section; and
a second member provided between the first members, between adjacent ones of the light emitting sections,
in which a refractive index of the first member is larger than a refractive index of the second member.

(10)

The display device according to any one of (1) to (9),
in which the light emitting section is a light emitting element including an organic light emitting diode, and
the display device is an organic EL display.

(11)

An electronic apparatus including:
a display device configured to perform display on a basis of an image signal,
in which the display device includes
a plurality of light emitting sections formed on a substrate, and
a color filter provided on the light emitting section to correspond to each of the plurality of light emitting sections, and
the light emitting sections and the color filters are arranged such that, in at least a partial region in a display surface, a relative misalignment between a center of a luminescence surface of the light emitting section and a center of the color filter corresponding to the light emitting section is created in a plane perpendicular to a stacking direction.

REFERENCE SIGNS LIST 1, 1a, 1b display device
10 light emitting element
11 first substrate
15 TFT
21 first electrode
22 second electrode
23 organic layer
24 luminescence section
25 opening
31 protection film
32 planarizing film
33 CF layer
33R, 33G. 33B CF
34 second substrate
35 sealing resin film
51 first member
52 second member
53 reflector
101 display surface
301 smartphone (electronic apparatus)
311 digital camera (electronic apparatus)
331 HMD (electronic apparatus)

The invention claimed is:
1. A display device comprising:
a first area of the display device, a first direction in a top view of the display device is perpendicular to a second direction in the top view of the display device;
a second area of the display device, the first area and the second area are disposed along in the first direction; and
a third area of the display device, the first area and the third area are disposed along in the second direction,
wherein in the first area:
a plurality of first light emitting sections are formed on a substrate,
a plurality of first color filters are disposed at a light emission direction,
each of the first light emitting sections correspond to each of the first color filters,
a first distance in a cross sectional view of the display device is a distance between a center of one of the first light emitting sections and a center of a corresponding one of the first color filters,
wherein in the second area:
a plurality of second light emitting sections are formed on the substrate,
a plurality of second color filters are disposed at the light emission direction,
each of the second light emitting sections correspond to each of the second color filters, a second distance in the cross sectional view of the display device is a distance between a center of one of the second light emitting sections and a center of a corresponding one of the second color filters, wherein in the third area:
a plurality of third light emitting sections are formed on the substrate,
a plurality of third color filters are disposed at a light emission direction,
each of the third light emitting sections correspond to each of the third color filters,
a third distance in the cross sectional view of the display device is a distance between a center of one of the third light emitting sections and a center of a corresponding one of the third color filters, wherein the first distance differs from the second distance, the third distance differs from the first distance.

2. The display device according to claim 1, wherein said each of the first light emitting sections is a light emitting element comprising an organic light emitting diode, and the display device is an organic EL display.

3. The display device according to claim 1, wherein said each of the second light emitting sections is a light emitting element comprising an organic light emitting diode, and the display device is an organic EL display.

4. The display device according to claim 1, wherein said each of the third light emitting sections is a light emitting element comprising an organic light emitting diode, and the display device is an organic EL display.

5. The display device according to claim 1, wherein the first light emitting sections and the first color filters are arranged such that, in at least a partial region in a display surface, a relative misalignment between a center of a luminescence surface of the first light emitting sections and the center of the first color filter is created in a plane perpendicular to a stacking direction.

6. The display device according to claim 5, wherein the second light emitting sections and the second color filters are arranged such that, in at least the partial region in the display surface, a relative misalignment between a center of a luminescence surface of the second light emitting sections and the center of the second color filter is created in a plane perpendicular to a stacking direction.

7. The display device according to claim 6, wherein the third light emitting sections and the third color filters are arranged such that, in at least the partial region in the display surface, a relative misalignment between a center of a luminescence surface of the third light emitting sections and the center of the third color filter is created in a plane perpendicular to a stacking direction.

8. The display device according to claim 5, wherein the first area, the second area and the third area have a distribution in the display surface in a manner that creates relative misalignment.

9. The display device according to claim 8, wherein a plurality of regions are set in the display surface and an area of a color filter located between adjacent ones of the regions is different from an area of another color filter, and thereby the relative misalignment is created with amounts of misalignment different from each other between regions.

10. The display device according to claim 8, wherein an amount of misalignment in the relative misalignment and a misalignment direction of the center of the color filter corresponding to the light emitting section with respect to the center of the luminescence surface of the light emitting section in the plane perpendicular to the stacking direction are set in accordance with a viewing angle required of a pixel including the light emitting section and the color filter in which the relative misalignment is created.

11. The display device according to claim 8, wherein, in the relative misalignment, a misalignment direction of the center of the color filter corresponding to the light emitting section with respect to the center of the luminescence surface of the light emitting section in the plane perpendicular to the stacking direction is a direction from a center of the display surface toward a position where the light emitting section and the color filter in which the relative misalignment is created exist in the display surface.

12. The display device according to claim 8, wherein the areas of the color filters gradually change in the display surface, and thereby the relative misalignment is created.

13. The display device according to claim 8, wherein a pitch with which the light emitting sections are arranged on the substrate is different in at least a partial region from the pitch in another region, and thereby the relative misalignment is created.

14. The display device according to claim 8, wherein an amount of misalignment of the relative misalignment becomes larger with proximity to an outer edge of the display surface.

15. The display device according to claim 1, further comprising:
a third member provided immediately above the light emitting section, having a substantially truncated conical or pyramidal shape in which a cross-sectional area in an in-plane direction perpendicular to the stacking direction gradually increases with proximity to a top, and configured to propagate emission light from the light emitting section.

16. The display device according to claim 15, wherein a second member provided between the third members, between adjacent ones of the light emitting sections.

17. The display device according to claim 16, wherein a refractive index of the third member is larger than a refractive index of the second member.

18. An electronic apparatus comprising:
the display device according to claim 1.

* * * * *